US009305481B2

(12) United States Patent
Koyama et al.

(10) Patent No.: US 9,305,481 B2
(45) Date of Patent: Apr. 5, 2016

(54) DISPLAY DEVICE

(75) Inventors: Jun Koyama, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1189 days.

(21) Appl. No.: 12/887,179

(22) Filed: Sep. 21, 2010

(65) Prior Publication Data

US 2011/0069047 A1    Mar. 24, 2011

(30) Foreign Application Priority Data

Sep. 24, 2009  (JP) .................................. 2009-218931

(51) Int. Cl.
  *G09G 5/00*      (2006.01)
  *G09G 3/20*      (2006.01)
  *G02F 1/1345*    (2006.01)

(52) U.S. Cl.
  CPC ............... *G09G 3/20* (2013.01); *G02F 1/1345* (2013.01); *G09G 2310/0275* (2013.01)

(58) Field of Classification Search
  CPC ........................................................ G09G 5/00
  USPC .............................................. 437/40; 345/92
  See application file for complete search history.

(56) References Cited

U.S. PATENT DOCUMENTS

| 5,612,234 | A | * | 3/1997 | Ha ................................. 438/163 |
| 5,731,856 | A | | 3/1998 | Kim et al. |
| 5,744,864 | A | | 4/1998 | Cillessen et al. |
| 5,977,569 | A | * | 11/1999 | Li ................................. 257/119 |
| 6,294,274 | B1 | | 9/2001 | Kawazoe et al. |
| 6,563,174 | B2 | | 5/2003 | Kawasaki et al. |
| 6,627,489 | B1 | * | 9/2003 | Plais et al. ..................... 438/199 |
| 6,642,916 | B1 | | 11/2003 | Kodama et al. |
| 6,727,522 | B1 | | 4/2004 | Kawasaki et al. |
| 6,803,896 | B2 | | 10/2004 | Senda et al. |

(Continued)

FOREIGN PATENT DOCUMENTS

EP      1251485 A     10/2002
EP      1 737 044 A1  12/2006

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Amare Mengistu
*Assistant Examiner* — Shawna Stepp Jones
(74) *Attorney, Agent, or Firm* — Fish & Richardson P.C.

(57) ABSTRACT

A display device includes a driver circuit including a logic circuit including a first transistor which is a depletion type transistor and a second transistor which is an enhancement type transistor; a signal line which is electrically connected to the driver circuit; a pixel portion including a pixel whose display state is controlled by input of a signal including image data from the driver circuit through the signal line; a reference voltage line to which reference voltage is applied; and a third transistor which is a depletion type transistor and controls electrical connection between the signal line and the reference voltage line. The first to the third transistors each include an oxide semiconductor layer including a channel formation region.

21 Claims, 30 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,304,632 B2 | 12/2007 | Kodama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0041763 A1 | 3/2004 | Kodama et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0219411 A1 | 9/2010 | Hoffman et al. |

FOREIGN PATENT DOCUMENTS

| | | |
|---|---|---|
| EP | 1 770 788 A2 | 4/2007 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-301537 A | 11/1998 |
| JP | 11-085115 A | 3/1999 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-311908 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-222072 A | 8/2005 |
| JP | 2007-004733 A | 1/2007 |
| JP | 2007-096055 A | 4/2007 |
| JP | 2007-123861 A | 5/2007 |
| JP | 2007-529119 A | 10/2007 |
| JP | 2007-299913 A | 11/2007 |
| JP | 2008-124215 A | 5/2008 |
| JP | 2009-004733 A | 1/2009 |
| TW | 562958 | 11/2003 |
| WO | 2004/114391 A1 | 12/2001 |
| WO | 2005/093850 A1 | 10/2005 |
| WO | 2008/143304 A1 | 11/2008 |

OTHER PUBLICATIONS

Asaoka, Y et al., "29.1: Polarizer-Free Reflective LCD Combined With Ultra Low-Power Driving Technology," SID Digest '09 : SID

(56) References Cited

OTHER PUBLICATIONS

International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

(56) References Cited

OTHER PUBLICATIONS

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

International Search Report, PCT Application No. PCT/JP2010/064975, dated Nov. 22, 2010, 3 pages.

Written Opinion, PCT Application No. PCT/JP2010/064975, dated Nov. 22, 2010, 5 pages.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Taiwanese Office Action (Application No. 099130882) Dated Jul. 2, 2015.

* cited by examiner

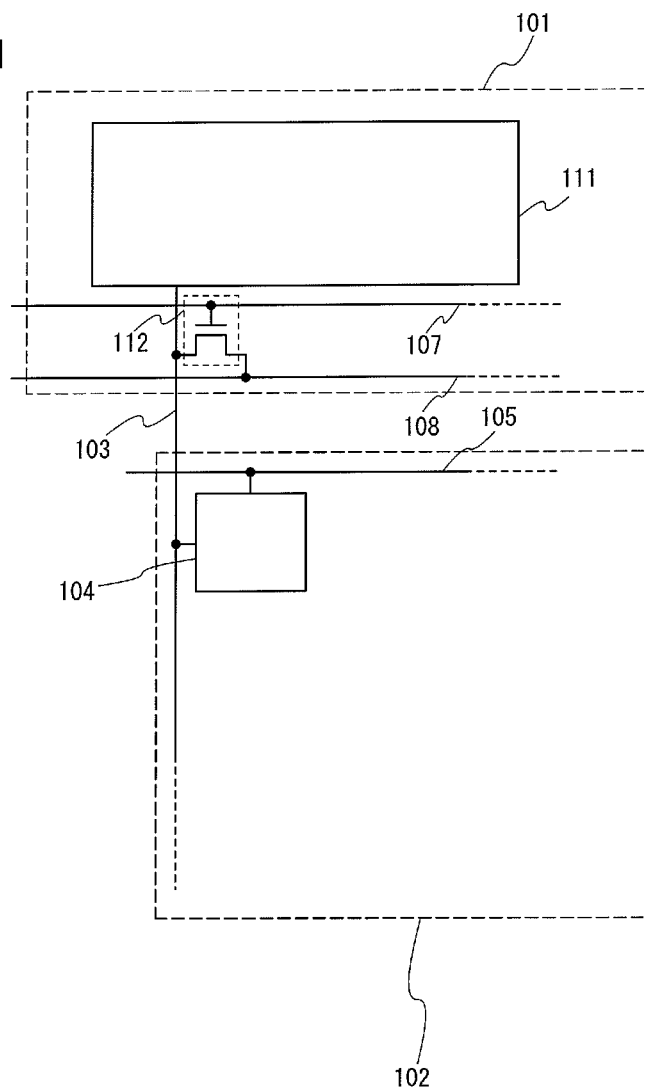

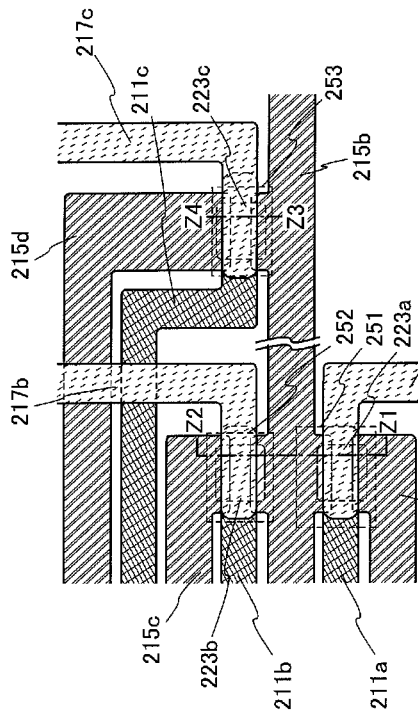
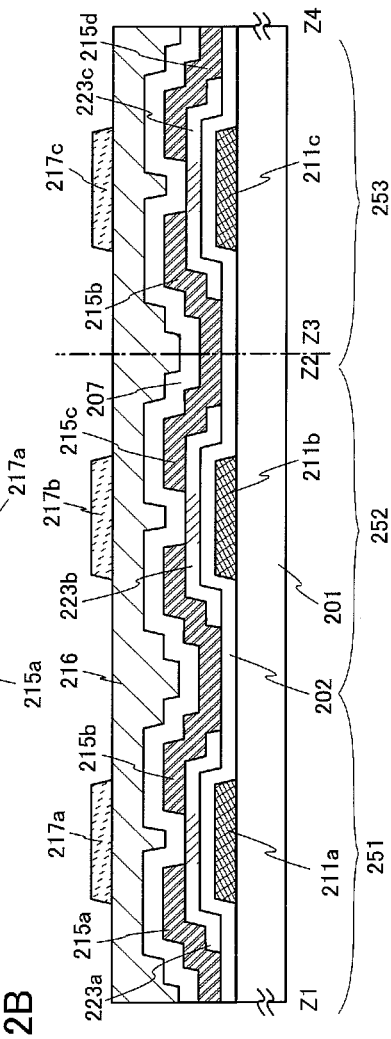
FIG. 2A
FIG. 2B

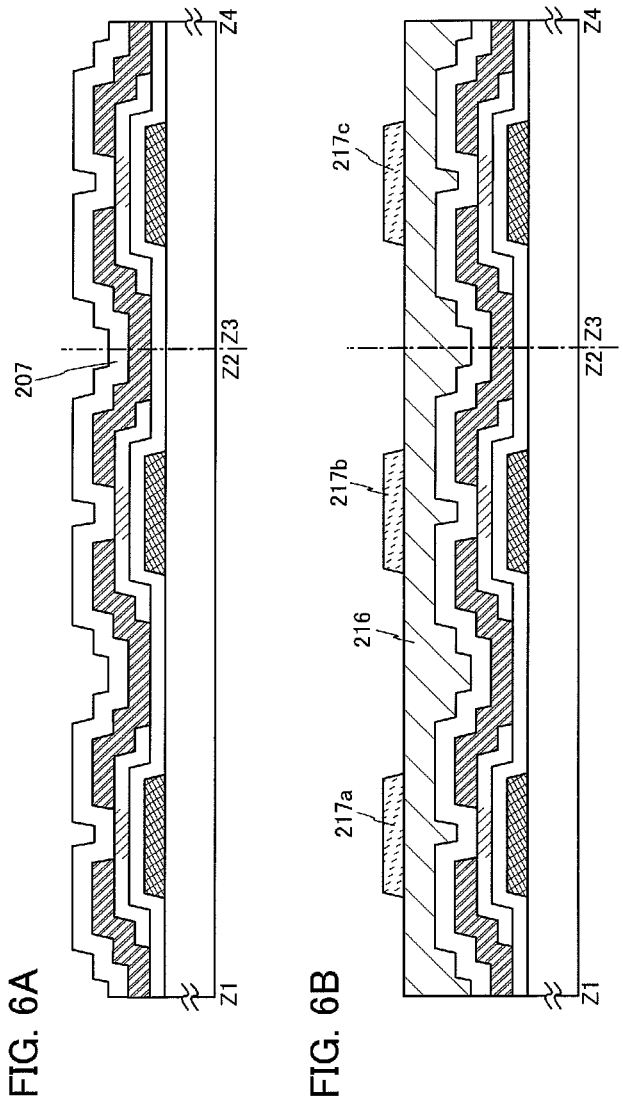

FIG. 19A1
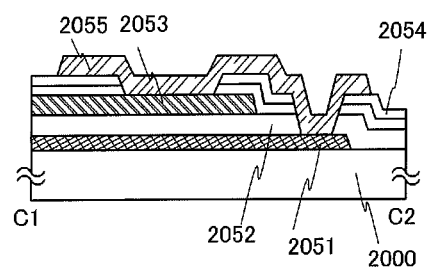
FIG. 19A2
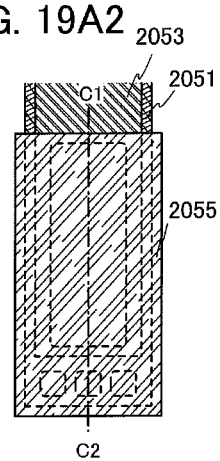
FIG. 19B1
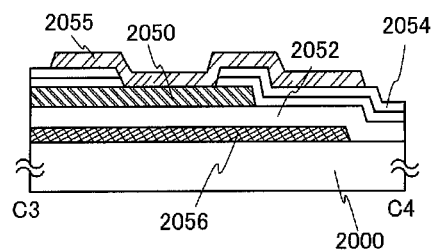
FIG. 19B2
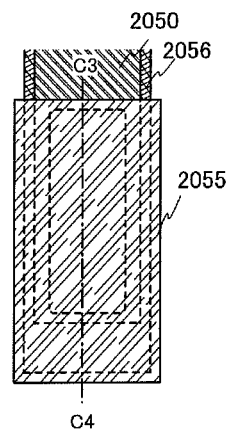

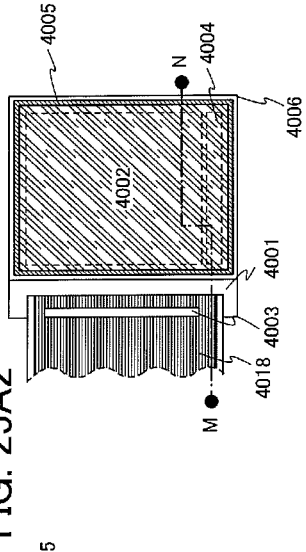
FIG. 25A1
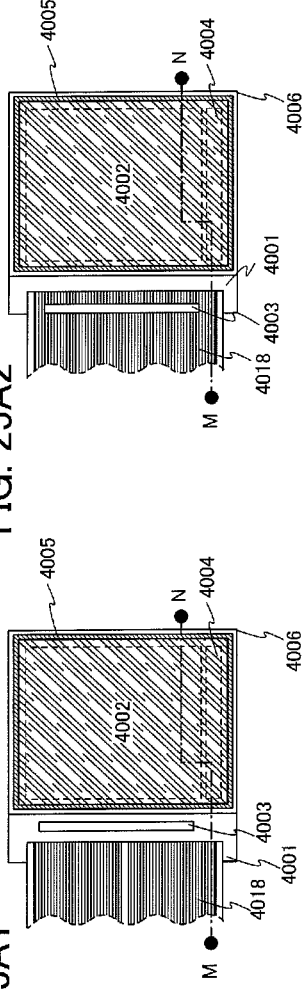
FIG. 25A2
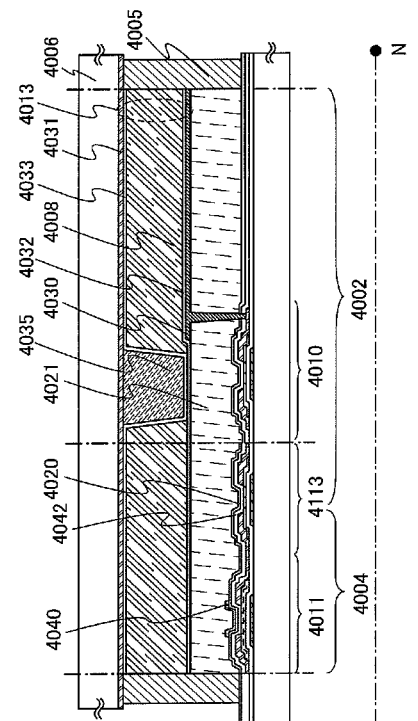
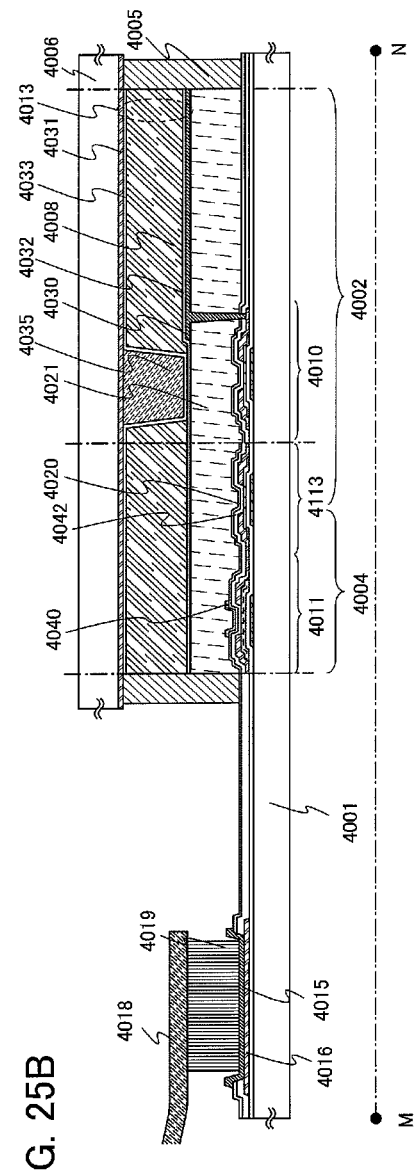
FIG. 25B

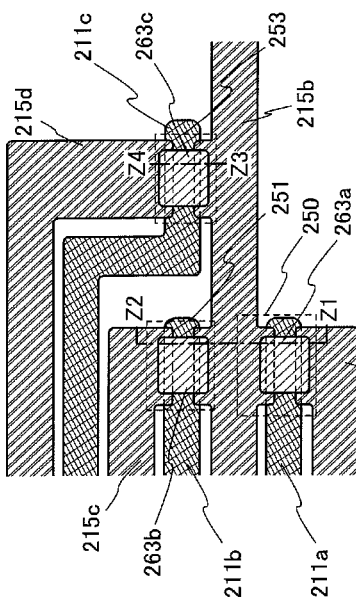
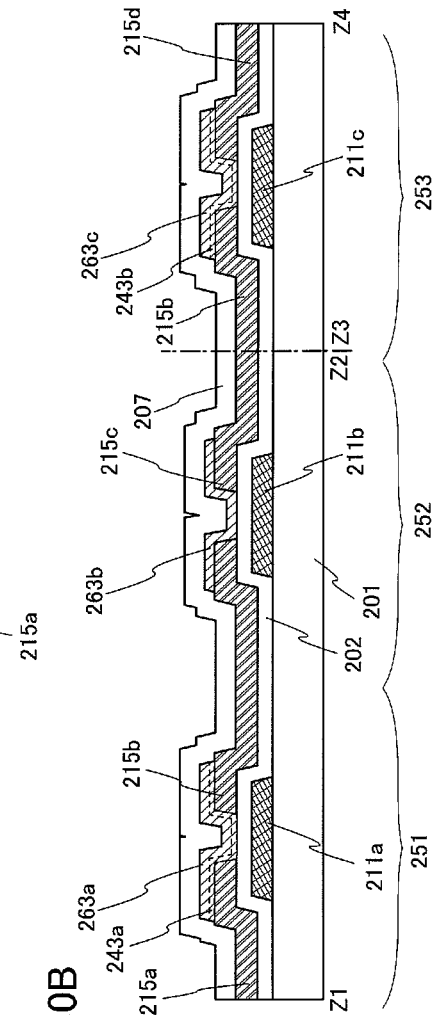
FIG. 30A
FIG. 30B

DISPLAY DEVICE

TECHNICAL FIELD

The present invention relates to a display device including a transistor including an oxide semiconductor.

BACKGROUND ART

As typically seen in a liquid crystal display device, a thin film transistor (TFT) formed over a flat plate such as a glass substrate is generally manufactured using a semiconductor material such as amorphous silicon or polycrystalline silicon. TFTs manufactured using amorphous silicon have low field-effect mobility, but can be formed over a large glass substrate. On the other hand, TFTs manufactured using crystalline silicon have high field-effect mobility, but due to the necessity of a crystallization step such as laser annealing, the transistors are not always suitable for being formed over a large glass substrate.

In view of the foregoing, attention has been drawn to a technique by which a TFT is manufactured using an oxide semiconductor as a semiconductor material and applied to an electronic appliance or an optical device. For example, Patent Document 1 and Patent Document 2 disclose a technique by which a TFT is manufactured using zinc oxide or an In—Ga—Zn—O-based oxide semiconductor as a semiconductor material and used as a switching element or the like of an image display device.

The field-effect mobility of a TFT in which a channel formation region is formed in an oxide semiconductor is higher than that of a TFT using amorphous silicon. An oxide semiconductor film can be formed at a temperature of 300° C. or lower by a sputtering method or the like, and the manufacturing process of the TFT including an oxide semiconductor is simpler than that of the TFT using polycrystalline silicon.

TFTs which are formed using such an oxide semiconductor over a glass substrate, a plastic substrate, or the like are expected to be applied to display devices such as a liquid crystal display, an electroluminescent display (also referred to as an EL display), and an electronic paper.

In the case where the TFTs including an oxide semiconductor are applied to a display device, the TFTs can be applied to, for example, TFTs included in a pixel portion or TFTs included in a driver circuit. A driver circuit of a display device includes, for example, a shift register circuit or a buffer circuit, and the shift register circuit and the buffer circuit include a logic circuit. Therefore, by using a TFT including an oxide semiconductor as a TFT in the logic circuit, the driving speed of the driver circuit can be improved.

In the above display device, there is a problem in that unwanted charge build-up is caused in elements, electrodes, or wirings during manufacture or operation. In the case of a transistor, for example, such charge build-up will generate a parasitic channel which allows leakage current to flow. Further, in the case of a bottom gate transistor, charge may build up on a surface of or in a back channel portion in a semiconductor layer (i.e., a region of a semiconductor layer which is sandwiched between a source electrode and a drain electrode which are formed over the semiconductor layer) and generate a parasitic channel, in some cases. In addition, an oxide semiconductor has a relatively wide band gap as a semiconductor; accordingly, when an oxide semiconductor is used for a channel formation layer of a transistor, the transistor has high off resistance. Consequently, in the transistor whose channel formation layer includes an oxide semiconductor, unwanted charge build-up is likely to occur, and thus a parasitic channel is likely to be generated and leakage current is likely to flow. Accordingly, in order to realize desired operation of a driver circuit and a pixel portion, unwanted charge build-up, which is a cause of a parasitic channel, is preferably small.

[Reference]

[Patent Document 1] Japanese Published Patent Application No. 2007-123861

[Patent Document 2] Japanese Published Patent Application No. 2007-96055

DISCLOSURE OF INVENTION

An object of one embodiment of the present invention is to reduce unwanted charge build-up.

One embodiment of the present invention is a display device which includes a driver circuit, a pixel portion including a pixel electrically connected to the driver circuit through a signal line, and a switching element which is selectively turned on for discharging unwanted charge if charge builds up in the signal line or an element, electrode, or wiring which is electrically connected to the signal line. Thus, unwanted charge-build up is reduced, whereby leakage current can be reduced.

One embodiment of the present invention is a display device which includes a driver circuit including a logic circuit including a first transistor which is a depletion type transistor and a second transistor which is an enhancement type transistor; a signal line; a pixel portion including a pixel whose display state is controlled by input of a signal including image data from the driver circuit through the signal line; and a third transistor which is a depletion type transistor and includes a gate, a source, and a drain. In the third transistor, one of the source and the drain is supplied with a reference voltage, the other of the source and the drain is electrically connected to the signal line, and a gate signal is input to the gate. The first to third transistors each include an oxide semiconductor layer including a channel formation region.

In one embodiment of the present invention, the first to third transistors may each include a gate electrode, a gate insulating layer over the gate electrode, a first conductive layer and a second conductive layer over parts of the oxide semiconductor layer over the gate insulating layer, the first conductive layer and the second conductive layer each serving as the source electrode or the drain electrode, and an oxide insulating layer over the oxide semiconductor layer, the first conductive layer, and the second conductive layer.

In one embodiment of the present invention, the thickness of the oxide semiconductor layer in the first transistor may be larger than the thickness of the oxide semiconductor layer in the second transistor, and the thickness of the oxide semiconductor layer in the third transistor may be larger than the thickness of the oxide semiconductor layer in the second transistor.

In one embodiment of the present invention, a conductive layer may be provided over the channel formation region with the oxide insulating layer interposed between the conductive layer and the channel formation region.

According to one embodiment of the present invention, if unwanted charge build-up occurs, it is possible to discharge the charge outside. Thus, unwanted charge build-up can be reduced.

BRIEF DESCRIPTION OF DRAWINGS

FIG. 1 illustrates an example of a structure of a display device according to Embodiment 1.

FIGS. 2A and 2B illustrate an example of a structure of a display device according to Embodiment 2.

FIGS. 6A and 6B are cross-sectional views illustrating an example of a manufacturing method of the display device in FIGS. 2A and 2B.

FIGS. 19A1 to 19B2 each illustrate a structure of a pixel in a display device according to Embodiment 7.

FIGS. 25A1 to 25B are top views and a cross-sectional view illustrating a structure of a display device according to Embodiment 10.

FIGS. 30A and 30B illustrate an example of a structure of a display device according to Embodiment 13.

BEST MODE FOR CARRYING OUT THE INVENTION

Figure 3:
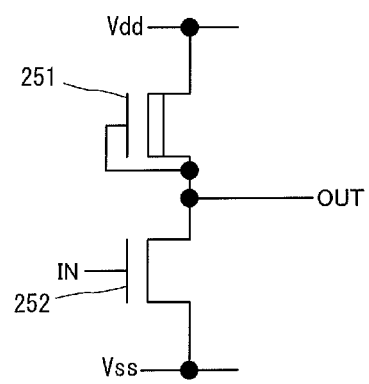
FIG. 3 illustrates an equivalent circuit of the display device in FIGS. 2A and 2B.

Hereinafter, embodiments of the present invention are described below with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below.

Embodiment 1

In this embodiment, a display device which is one embodiment of the present invention will be described.

An example of a structure of the display device in this embodiment will be described with reference to FIG. 1. FIG. 1 illustrates an example of a structure of the display device in this embodiment.

The display device in FIG. 1 includes a driver circuit portion 101 and a pixel portion 102. In addition, the display device includes a signal line 103.

The driver circuit portion 101 includes a driver circuit 111 and a transistor 112.

The driver circuit 111 is a circuit which controls display operation of the display device and includes, for example, a combinational logic circuit. Examples of a combinational logic circuit include an inverter, which includes a depletion type transistor and an enhancement type transistor, for example.

Note that a depletion type transistor is a transistor which has a negative threshold voltage in the case where the transistor is an n-channel transistor and has a positive threshold voltage in the case where the transistor is a p-channel transistor, whereas an enhancement type transistor is a transistor which has a positive threshold voltage in the case where the transistor is an n-channel transistor and has a negative threshold voltage in the case where the transistor is a p-channel transistor.

The transistor 112 is a depletion type transistor and has a gate, a source, and a drain.

The gate refers to part of a gate electrode and gate wiring or to the entire part of gate electrode and gate wiring. The gate wiring is a wiring for electrically connecting a gate electrode of at least one transistor to another electrode or another wiring. For example, a scan line in a display device is included in a gate wiring.

The source refers to part of a source region, a source electrode, and a source wiring or to the entire part thereof. The source region is a region in a semiconductor layer in which the resistivity is equal to or less than a given value. The source electrode is part of a conductive layer which is connected to the source region. The source wiring is a wiring for electrically connecting a source electrode of at least one transistor to another electrode or another wiring. For example, if a signal line in a display device is electrically connected to a source electrode, the signal line is also included in a source wiring.

The drain refers to part of a drain region, a drain electrode, and a drain wiring or to the entire part thereof. The drain region is a region in a semiconductor layer in which the resistivity is equal to or less than a given value. The drain electrode is part of a conductive layer which is connected to the drain region. The drain wiring is a wiring for electrically connecting a drain electrode of at least one transistor to another electrode or another wiring. For example, if a signal line in a display device is electrically connected to a drain electrode, the signal line is also a drain wiring.

In this document (the specification, the claims, the drawings, and the like), since the source and the drain of the transistor may interchange depending on the structure, the operating condition, and the like of the transistor, it is difficult to define which is a source or a drain. Therefore, in this document (the specification, the claims, the drawings, and the like), one terminal selected from a source and a drain is called one of the source and drain, while the other terminal is called the other of the source and drain.

Note that in general, a voltage refers to a difference between potentials of two points (also referred to as a potential difference). However, both the value of a voltage and the value of a potential are represented by volts (V) and therefore it is difficult to distinguish them. Thus, in this document (the specification and the claims), a difference between a potential at one point and a potential which is a reference (also referred to as a reference potential) is given as a voltage of the one point in some cases unless otherwise specified.

One of the source and drain of the transistor 112 is electrically connected to the signal line 103 and the transistor 112 enters an on state (ON) or an off state (OFF) depending on a gate voltage. As illustrated in FIG. 1, for example, a scan line 107 is additionally provided and electrically connected to the gate of the transistor 112, and the gate voltage of the transistor 112 is controlled by a gate signal input to the gate of the transistor 112 through the scan line 107. The scan line 107 is, for example, electrically connected to the scan line driver circuit, whereby the voltage applied to the scan line 107 can be controlled. The other of the source and drain of the transistor 112 is grounded or supplied with a predetermined voltage (also referred to as a reference voltage or Vref). The reference voltage is supplied to the other of the source and drain of the transistor 112, for example, by providing a reference voltage line 108 and electrically connecting the other of the source and drain of the transistor 112 to the reference voltage line 108 as illustrated in FIG. 1. The transistor 112 enters an on state or an off state, whereby the transistor 112 serves as a switching element for discharging charge through the signal line 103 in a non-selection period if charge builds up in the signal line 103 or an element, electrode, or wiring which is electrically connected to the signal line 103.

Note that the structure of the display device is not limited to the structure illustrated in FIG. 1, and the transistor 112 can be a multi-gate transistor including a plurality of channel formation regions. Further, a plurality of transistors having the same structure as the transistor 112 can be electrically connected in parallel.

The pixel portion 102 includes a pixel 104. Note that in the pixel portion 102, a plurality of pixels 104 may be arranged in rows and columns. In the case where a plurality of pixels 104 are arranged in rows, the same number of scan lines as the number of rows of the pixels are provided. In the case where a plurality of pixels 104 are arranged in columns, the same number of signal lines as the number of columns of the pixels are provided. Further, in the case where a plurality of signal lines are arranged in columns, the transistor 112 may be provided for each signal line and one of the source and drain of the transistors 112 may be electrically connected to the respective signal lines.

The pixel 104 is supplied with a signal including image data from the driver circuit 111 through the signal line 103, whereby its display state is controlled. The pixel 104, for example, includes a switching element such as a transistor and a display element such as a liquid crystal element or a light-emitting element, a state of which is controlled by turning on or off of the switching element. The timing at which image data is input is set in accordance with, for example, a signal which is input through a scan line 105 in the case where the scan line 105 is additionally provided as illustrated in FIG. 1.

Note that in the display device illustrated in FIG. 1, the depletion type transistor in the driver circuit 111 and the depletion type transistor used as the transistor 112 can have the same structure; for example, they both can have an oxide semiconductor layer which includes a channel formation region. Further, in the display device illustrated in FIG. 1, the depletion type transistor in the driver circuit 111 and the depletion type transistor used as the transistor 112 can have the same conductivity type. However, this embodiment is not limited thereto; for example, the structure of the transistor 112 can be different from that of the transistor in the driver circuit 111.

Further, as the transistor in the driver circuit 111 and the transistor 112, bottom gate transistors can be used, for example.

Further, the channel width of the transistor 112 may be larger than that of the transistor in the driver circuit 111. By making the channel width of the transistor 112 sufficiently large, an effect of unwanted charge build-up on switching operation of the transistor 112 can be reduced.

Next, an example of operation of the display device illustrated in FIG. 1 will be described. Note that, in this given example, the transistor 112 is an n-channel transistor and a scan signal which is input through the scan line 105 and the scan line 107 is a binary digital signal having a first voltage level and a second voltage level. The scan signal which is input through the scan line 105 has voltage V1 (also simply referred to as V1) in the first voltage level and voltage V2 (also simply referred to as V2) in the second voltage level; whereas the scan signal which is input through the scan line 107 has voltage V2 in the first voltage level and voltage V3 (also simply referred to as V3) in the second voltage level. Voltage V1 is higher than voltage V2, voltage V3 is lower than voltage V2, and voltage V2 is at ground potential. In addition, ground potential (also referred to as Vgnd) is applied to the reference voltage line 108.

An example of operation of the display device illustrated in FIG. 1 is divided into a period in which the pixel 104 is not selected (also referred to as a non-selection period) and a period in which the pixel 104 is selected (also referred to as a selection period). In the case where a plurality of pixels 104 are arranged in rows and columns, the non-selection period is a period in which none of the pixels 104 is selected, whereas the selection period is a period in which any one of the pixels 104 is selected.

First, in the non-selection period, the voltage of the scan line 105 is voltage V2 and the voltage of the scan line 107 (also referred to as $V_{107}$) is voltage V2.

Since the transistor 112 enters an on state at this time due to the voltage of the scan line 107, the signal line 103 and the reference voltage line 108 are brought into electrical connection; thus, if charge builds up in the signal line 103 or an element, electrode, or wiring which is electrically connected to the signal line 103, the built up charge is discharged to the reference voltage line 108 through the signal line 103 and the transistor 112.

Next, in the selection period, the voltage of the scan line 105 changes to voltage V1 and the voltage of the scan line 107 changes to voltage V3.

At this time, the transistor 112 enters an off state; thus, a signal including image data is input from the driver circuit 111 to the pixel 104 through the signal line 103. The pixel 104 to which a signal including image data is input is brought into a display state in accordance with the input image data.

Also in the case where a plurality of pixels 104 are arranged in rows and columns, similar operation is performed. First, since the transistors 112 which are electrically connected to the respective signal lines 103 enter an on state in the non-selection period, the signal lines 103 and the reference voltage line 108 are brought in to electrical connection; thus, if charge builds up in the signal lines 103 or an element, electrode, or wiring which is electrically connected to the signal lines 103, the charge is discharged to the reference voltage line 108 through the signal lines 103 and the transistors 112. In the selection period, the transistors 112 enter an off state, and image data is input to the pixels 104 through the scan lines 105 sequentially. The pixel to which image data is input is brought into a display state.

A plurality of non-selection periods in which the transistor 112 enters an on state may be provided. For example, the non-selection period can be provided to switch the transistor 112 to an on state, between a selection period in a frame and a selection period in the following frame.

As described above, in the display device of this embodiment, if charge builds up in an element, electrode, or wiring which is electrically connected to the signal line, the built up charge can be selectively discharged to the reference voltage line through the signal line. In addition, when a display device is formed using a bottom gate transistor, if charge builds up in a back channel portion, the built up charge can be discharged to the reference voltage line through the signal line. Thus, generation of a parasitic channel can be suppressed and leakage current can be reduced.

Further, when a depletion type transistor is used as the transistor for discharging unwanted built up charge, the transistor can be switched to an on state without voltage application. Thus, unwanted built up charge can be discharged when the display device is not operated; accordingly, influence on the display operation can be suppressed.

Embodiment 2

In this embodiment, an example of a structure of a driver circuit portion in a display device which is one embodiment of the present invention will be described.

A structure of the driver circuit portion of this embodiment will be described with reference to FIGS. 2A and 2B. FIGS. 2A and 2B illustrate an example of the structure of the driver circuit portion in this embodiment. FIG. 2A is a top view and FIG. 2B is a cross-sectional view taken along line Z1-Z2 and line Z3-Z4 of FIG. 2A.

The driver circuit portion illustrated in FIGS. 2A and 2B includes a transistor 251, a transistor 252, and a transistor 253 over a substrate 201.

The transistor 251 and the transistor 252 are examples of an element used in a logic circuit in the driver circuit 111 illustrated in FIG. 1. The equivalent circuit diagram of the transistors is illustrated in FIG. 3.

The transistor 251 is a depletion type transistor and a high power supply voltage (also referred to as Vdd) is applied to one of its source and drain. A gate and the other of the source and drain of the transistor are electrically connected to each other (i.e., the transistor 251 is diode-connected).

Note that although the gate and the other of the source and drain are electrically connected in the transistor 251 illustrated in FIG. 3 (i.e., the transistor 251 is diode-connected), the structure is not limited thereto. For example, the gate may be electrically connected to the one of the source and drain of the transistor 251. Further, another signal may be input through the gate.

The transistor 252 is an enhancement type transistor in which a signal is input through a gate, one of a source and drain of the transistor 252 is electrically connected to the other of the source and drain, and a low power supply voltage (also referred to as Vss) is applied to the other of the source and drain. The low power supply voltage is at ground potential or a given voltage, for example.

Note that the high power supply voltage is relatively higher than the low power supply voltage, and the low power supply voltage is relatively lower than the high power supply voltage. Each value is set as appropriate depending on specifications of the circuit or the like, and thus there is no particular limitation on the value. For example, even when the value of Vdd is higher than the value of Vss, the value of |Vdd| is not always higher than the value of |Vss|. Moreover, even when the value of Vdd is higher than the value of Vss, the value of Vgnd is not always equal to or higher than the value of Vss.

For example, when a high-level digital signal is input to the gate of the transistor 251 as an input signal (also referred to as IN), the logic circuit outputs a low-level digital signal as an output signal (also referred to as OUT), whereas when a low-level digital signal is input to the gate of the transistor 251, the logic circuit outputs a high-level digital signal as an output signal.

The transistor 253 corresponds to the transistor 112 illustrated in FIG. 1.

Next, structures of the transistors will be described. The transistor 251 includes a gate electrode 211a over the substrate 201, a gate insulating layer 202 over the gate electrode 211a, an oxide semiconductor layer 223a over the gate electrode 211a with the gate insulating layer 202 interposed therebetween, and a conductive layer 215a and a conductive layer 215b over parts of the oxide semiconductor layer 223a.

The transistor 252 includes a gate electrode 211b over the substrate 201, the gate insulating layer 202 over the gate electrode 211b, an oxide semiconductor layer 223b over the gate electrode 211b with the gate insulating layer 202 interposed therebetween, and the conductive layer 215b and the conductive layer 215c over parts of the oxide semiconductor layer 223b.

The transistor 253 includes a gate electrode 211c over the substrate 201, the gate insulating layer 202 over the gate electrode 211c, an oxide semiconductor layer 223c over the gate electrode 211c with the gate insulating layer 202 interposed therebetween, and the conductive layer 215b and a conductive layer 215d over parts of the oxide semiconductor layer 223c.

Each of the conductive layers 215a to 215d serves as a source electrode or a drain electrode.

The oxide semiconductor layers 223a to 223c are subjected to dehydration or dehydrogenation and an oxide insulating layer 207 is formed in contact with the oxide semiconductor layers 223a to 223c. A transistor including such an oxide semiconductor layer as a channel formation layer has high reliability because a V-th shift due to a long-term use or high load hardly occurs.

Note that a nitride insulating layer may be provided over the oxide insulating layer 207. It is preferable that the nitride insulating layer be in contact with the gate insulating layer 202 or an insulating layer serving as a base which is provided below the oxide insulating layer 207 so as to block entry of impurities such as moisture, hydrogen ions, and $OV^-$ from the vicinity of a side surface of the substrate. It is particularly effective to use a silicon nitride layer as the gate insulating layer 202, which is in contact with the oxide insulating layer 207, or the insulating layer serving as the base. In other words, when the silicon nitride layers are provided over, under, and around the oxide semiconductor layer so as to surround the oxide semiconductor layer, the reliability of the display device is improved.

Further, in the driver circuit portion illustrated in FIGS. 2A and 2B, a planarizing insulating layer 216 is provided over the oxide insulating layer 207. In addition, a conductive layer 217a is provided over the oxide semiconductor layer 223a with the oxide insulating layer 207 and the planarizing insulating layer 216 interposed therebetween, a conductive layer 217b is provided over the oxide semiconductor layer 223b with the oxide insulating layer 207 and the planarizing insulating layer 216 interposed therebetween, and a conductive layer 217c is provided over the oxide semiconductor layer 223c with the oxide insulating layer 207 and the planarizing insulating layer 216 interposed therebetween. Each of the conductive layers 217a to 217c serves as a second gate electrode. The second gate voltage is applied to the conductive layers 217a to 217c, whereby the threshold voltages of the transistors 251 to 253 can be controlled.

Note that the planarizing insulating layer 216 is not necessarily provided. In the case where the planarizing insulating layer 216 is not provided, the conductive layers 217a to 217c can be provided over the oxide insulating layer 207 (over the nitride insulating layer if provided).

For example, when a voltage equal to or higher than that of the source electrode is applied to each of the conductive layers 217a to 217c, the threshold voltages of the transistors are shifted to a negative side; when a voltage lower than that of the source electrode is applied to each of the conductive layers 217a to 217c, the threshold voltages of the transistors are shifted to a positive side.

For example, in the case of a depletion type transistor, the threshold voltage can be shifted to a positive side when the voltage of the second gate electrode is set sufficiently lower than that of the source electrode. Accordingly, by using the second gate electrode, depletion type transistors can be selectively changed into enhancement type transistors.

In the case of an enhancement type transistor, the threshold voltage can be shifted to a negative side when the voltage of the second gate electrode is set sufficiently higher than that of the source electrode. Accordingly, by using the second gate electrode, enhancement type transistors can be selectively changed into depletion type transistors.

In addition, in the case of an enhancement type transistor, the threshold voltage can be further shifted to a positive side when the voltage of the second gate electrode is set sufficiently lower than that of the source electrode. Thus, by applying a sufficiently low voltage to the second gate electrode, characteristics of the transistor can be changed so that the transistor remains off even when the input signal is high.

In the above manner, the threshold voltage of a transistor having a second gate electrode can be controlled by a voltage applied to the second gate electrode. Accordingly, if second gate voltages are applied to the respective second gate electrodes so that the transistor 251 becomes a depletion type while the transistor 252 becomes an enhancement type, for example, a logic circuit can be provided using the transistors including an oxide semiconductor. Further, by providing the transistor 253 of a depletion type, the depletion type transistor for discharging charge if charge builds up in the signal line or an element, electrode, or wiring which is electrically connected to the signal line, will be provided. Thus, even in a display device using transistors including an oxide semiconductor, leakage current can be reduced. In addition, when a display device is formed using a bottom gate transistor, if charge builds up in a back channel portion, the built up charge can be discharged to the reference voltage line through the signal line. Thus, generation of a parasitic channel can be suppressed and leakage current can be reduced.

Note that although in the driver circuit portion illustrated in FIGS. 2A and 2B, the conductive layers 217a to 217c are respectively provided over the transistors 251 to 253, the structure is not limited thereto. For example, a conductive layer serving as a second gate electrode may be provided only over a transistor which serves as an enhancement type transistor or only over a transistor which serves as a depletion type transistor.

Further, the display device of this embodiment may have a structure in which a gate electrode of a transistor in the logic circuit is directly connected to a source electrode or drain electrode of the other transistor. For example, if an opening is formed in the gate insulating layer 202 so that the gate electrode 211a of the transistor 251 may be in contact with the conductive layer 215b of the transistor 252, favorable contact can be provided, whereby contact resistance can be reduced. Accordingly, the number of openings can be reduced, which results in reducing the area occupied by the logic circuit.

Figure 4:
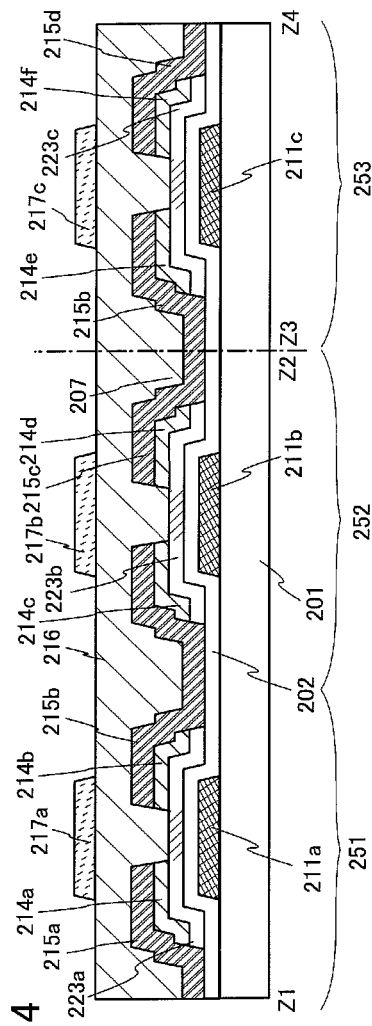
FIG. 4 illustrates an example of a structure of a display device according to Embodiment 2.

Alternatively, the display device of this embodiment may have a structure illustrated in FIG. 4. In the structure, an oxide conductive layer 214a and an oxide conductive layer 214b which serve as a pair of buffer layers are provided over the oxide semiconductor layer 223a, and the conductive layer 215a and the conductive layer 215b which serve as a pair of electrodes are provided in contact with the oxide conductive layer 214a and the oxide conductive layer 214b in the transistor 251; an oxide conductive layer 214c and an oxide conductive layer 214d which serve as a pair of buffer layers are provided over the oxide semiconductor layer 223b, and the conductive layer 215b and the conductive layer 215c which serve as a pair of electrodes are provided in contact with the oxide conductive layer 214c and the oxide conductive layer 214d in the transistor 252; and an oxide conductive layer 214e and an oxide conductive layer 214f which serve as a pair of buffer layers are provided over the oxide semiconductor layer 223c, and the conductive layer 215b and the conductive layer 215d which serve as a pair of electrodes are provided in contact with the oxide conductive layer 214e and the oxide conductive layer 214f in the transistor 253.

The oxide conductive layer 214a and the oxide conductive layer 214b, and the oxide conductive layer 214c and the oxide conductive layer 214d have higher conductivity than the oxide semiconductor layer 223a and the oxide semiconductor layer 223b, and serve as source regions and drain regions of the transistor 251 and the transistor 252.

As an oxide conductive film which is used for forming the oxide conductive layers 214a to 214f, a film of a conductive material that transmits visible light, such as an In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—Sn—O-based, In—O-based, Sn—O-based, or Zn—O-based metal oxide can be used. The thickness of the oxide conductive film is set as appropriate within the range of 1 nm to 300 nm inclusive. In the case of using a sputtering method, it is preferable that film formation be performed with a target including $SiO_2$ at 2 wt % to 10 wt % inclusive so that $SiO_x$ (x>0) which inhibits crystallization is included in the light-transmitting conductive film so that the light-transmitting conductive film may be prevented from being crystallized in heat treatment performed later for dehydration or dehydrogenation.

Further, if an In—Ga—Zn—O-based film is used as the oxide semiconductor layer and the oxide conductive layer, for example, the oxide semiconductor layers 223a to 223c serving as a channel formation region and the oxide conductive layers 214a to 214f serving as source regions and drain regions can be separately formed under different film formation conditions.

For example, in the case of film formation by a sputtering method, the oxide conductive layers 214a to 214f, which are formed using an oxide semiconductor film formed in an argon gas, have n-type conductivity and have an activation energy ($\Delta E$) of 0.01 eV to 0.1 eV inclusive.

Note that in this embodiment, the oxide conductive layers 214a to 214f are In—Ga—Zn—O-based films and include at least amorphous components. Moreover, the oxide conductive layers 214a to 214f may include crystal grains (also referred to as nanocrystals). The crystal grains in the oxide conductive layers 214a to 214f have a diameter of approximately 1 nm to 10 nm, typically approximately 2 nm to 4 nm.

The oxide conductive layers 214a to 214f are not necessarily provided, but if the oxide conductive layers 214a to 214f are provided between the oxide semiconductor layers 223a to 223c serving as channel formation layers and the conductive layers 215a to 215d serving as source electrodes and drain electrodes, good electrical junctions can be obtained and the transistors 251 to 253 can operate stably. Moreover, high mobility can be maintained at a high drain voltage.

Then, a manufacturing method of the driver circuit portion illustrated in FIG. 2 will be described with reference to FIGS. 5A to 5C and FIGS. 6A and 6B. FIGS. 5A to 5C and FIGS. 6A and 6B are cross-sectional views of an example of a manufacturing method of the driver circuit portion illustrated in FIGS. 2A and 2B.

First, the substrate 201 is prepared. A conductive film is formed over the substrate 201, and a first photolithography step is performed to form the gate electrode 211a, the gate electrode 211b, and the gate electrode 211c (see FIG. 5A). Note that the formed gate electrodes preferably have a tapered shape.

It is necessary that the substrate 201 have an insulating surface and have at least enough heat resistance to withstand heat treatment to be performed later. As the substrate 201, a glass substrate or the like can be used, for example.

As a glass substrate, if the temperature of a later heat treatment is high, a glass substrate whose strain point is 730° C. or higher is preferably used. As a glass substrate, a glass material such as aluminosilicate glass, aluminoborosilicate glass, or barium borosilicate glass is used, for example. Note that by containing a larger amount of barium oxide (BaO) than boric acid, a glass substrate which is heat-resistant and more practical can be obtained. Therefore, a glass substrate containing more BaO than $B_2O_3$ is preferably used.

Note that a substrate formed of an insulator such as a ceramic substrate, a quartz substrate, or a sapphire substrate may be used as the substrate 201 instead of the above glass substrate. Alternatively, a crystallized glass substrate or the like may be used.

An insulating film serving as a base film may be provided between the substrate 201 and the gate electrodes 211a to 211c. The base film has a function of preventing diffusion of an impurity element from the substrate 201, and can be formed to have a single-layer or stacked-layer structure using one or more of a silicon nitride film, a silicon oxide film, a silicon nitride oxide film, and a silicon oxynitride film.

As an example of a material of the conductive film for forming the gate electrodes 211a to 211c, a metal material such as molybdenum, titanium, chromium, tantalum, tungsten, aluminum, copper, neodymium, or scandium or an alloy material containing any of these materials as a main component can be used. The conductive film for forming the gate electrodes 211a to 211c can be formed with a single film or a stacked film containing one or plurality of these materials.

As the conductive film for forming the gate electrodes 211a to 211c, for example, a three-layer stack film including a titanium film, an aluminum film provided over the titanium film, and a titanium film provided over the aluminum film, or a three-layer stack film including a molybdenum film, an aluminum film provided over the molybdenum film, and a molybdenum film provided over the aluminum film is preferably used. Needless to say, a single layer film, a two-layer stack film, or a stack film of four or more layers may be used as the metal conductive film. When a stack of conductive films of a titanium film, an aluminum film, and a titanium film is used as the conductive film, etching can be performed by a dry etching method with a chlorine gas.

Then, the gate insulating layer 202 is formed over the gate electrodes 211a to 211c.

The gate insulating layer 202 can be formed to have a single-layer or stacked-layer structure of any of a silicon oxide layer, a silicon nitride layer, a silicon oxynitride layer, and a silicon nitride oxide layer by a plasma CVD method, a sputtering method, or the like. For example, when a silicon oxynitride layer is formed, it may be formed by a plasma CVD method using $SiH_4$, oxygen, and nitrogen as a film formation gas. The gate insulating layer 202 has a thickness of 100 nm to 500 nm inclusive. In the case of a stacked-layer structure, the first gate insulating layer with a thickness of 50 nm to 200 nm inclusive and the second gate insulating layer with a thickness of 5 nm to 300 nm inclusive are stacked in this order. When a silicon oxide film which is formed using a silicon target doped with phosphorus or boron is used as the gate insulating layer 202, entry of impurities (such as moisture, hydrogen ions, and $OH^-$) can be suppressed.

In this embodiment, a silicon nitride layer having a thickness of 200 nm or less is formed by a plasma CVD method as the gate insulating layer 202.

Then, an oxide semiconductor film with a thickness of 2 nm to 200 nm inclusive is formed over the gate insulating layer 202. The thickness is preferably 50 nm or less in order that the oxide semiconductor film may be amorphous even when heat treatment for dehydration or dehydrogenation is performed after the oxide semiconductor film is formed. By making the thickness of the oxide semiconductor film small, crystallization thereof can be suppressed when the heat treatment is performed after the formation of the oxide semiconductor layer.

Note that before the oxide semiconductor film is formed by a sputtering method, powdery substances which are generated at the time of the film formation and attached to a surface of the gate insulating layer 202 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate so that a surface may be modified. Note that instead of an argon atmosphere, nitrogen, helium, oxygen, or the like may be used.

As the oxide semiconductor film, any of the following can be used: an In—Ga—Zn—O-based film, an In—Sn—Zn—O-based oxide semiconductor film, an In—Al—Zn—O- based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—Sn—O-based oxide semiconductor film, an In—O-based oxide semiconductor film, a Sn—O-based oxide semiconductor film, and a Zn—O-based oxide semiconductor film. In this embodiment, the oxide semiconductor film is formed using an In—Ga—Zn—O-based oxide semiconductor target by a sputtering method. Alternatively, the oxide semiconductor film can be formed by a sputtering method in a rare gas (typically, argon) atmosphere, an oxygen atmosphere, or a mixed atmosphere including a rare gas (typically, argon) and oxygen. In the case of using a sputtering method, a film may be formed with a target including $SiO_2$ at 2 wt % to 10 wt % inclusive so that $SiO_x$ (x>0) which inhibits crystallization is included in the oxide semiconductor film. Accordingly, crystallization of oxide semiconductor layers which are to be formed later can be suppressed in heat treatment performed later for dehydration or dehydrogenation.

The oxide semiconductor film is preferably an oxide semiconductor film containing In, more preferably an oxide semiconductor containing In and Ga.

Here, the oxide semiconductor film is formed with use of an oxide semiconductor target including In, Ga, and Zn (at a composition ratio of $In_2O_3$:$Ga_2O_3$:ZnO=1:1:1 [molar ratio]), under conditions where the distance between the substrate and the target is 100 mm, the pressure is 0.6 Pa, the direct current (DC) power supply is 0.5 kW, and the atmosphere is oxygen (the proportion of the oxygen flow is 100%). Note that a pulse direct current (DC) power supply is preferable because powdery substances which are generated at the time of the film formation can be reduced and the film thickness can be made uniform. In this embodiment, an In—Ga—Zn—O-based film is formed using an In—Ga—Zn—O-based oxide semiconductor target by a sputtering method as the oxide semiconductor film.

Examples of a sputtering method include an RF sputtering method in which a high-frequency power source is used for a sputtering power supply, a DC sputtering method in which a DC power supply source is used for a sputtering power supply, and a pulsed DC sputtering method in which a bias is applied in a pulsed manner. An RF sputtering method is mainly used in the case where an insulating film is formed, and a DC sputtering method is mainly used in the case where a metal conductive film is formed.

In addition, there is also a multi-source sputtering apparatus in which a plurality of targets of different materials can be set. With the multi-source sputtering apparatus, films of different materials can be formed to be stacked in the same chamber, or a film can be formed by electric discharge of plural kinds of material at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Figure 5A:
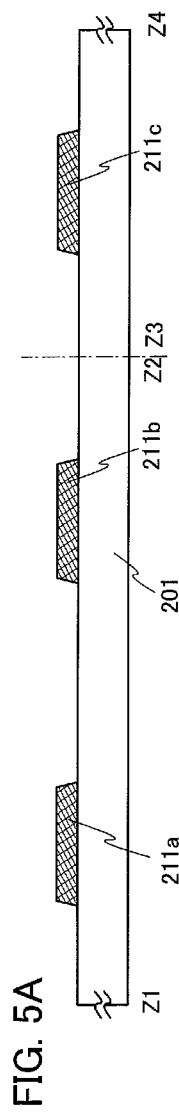
FIGS. 5A to 5C are cross-sectional views illustrating an example of a manufacturing method of the display device in FIGS. 2A and 2B.
Figure 5B:
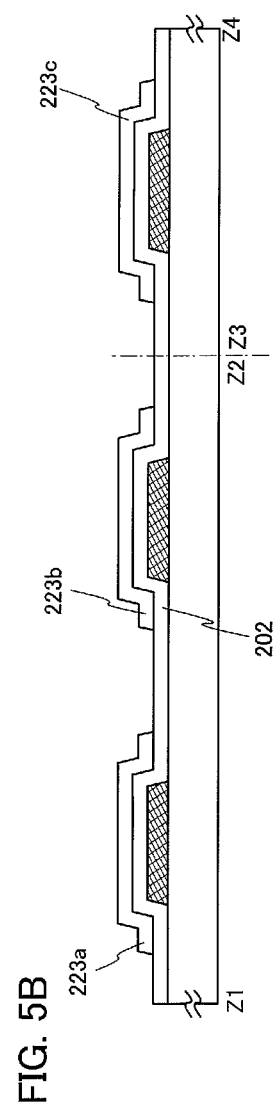

Then, the oxide semiconductor film is processed into islands by a second photolithography step, whereby the oxide semiconductor layer 223a, the oxide semiconductor layer 223b, and the oxide semiconductor layer 223c are formed (see FIG. 5B). Note that after the second photolithography step, it is preferable that the oxide semiconductor layers 223a to 223c be subjected to heat treatment (at 400° C. or higher and lower than 750° C.) in an inert gas atmosphere (such as nitrogen, helium, neon, or argon) in order to remove impurities such as hydrogen and water from the layers.

Next, the oxide semiconductor layers are subjected to dehydration or dehydrogenation. First heat treatment for dehydration or dehydrogenation is performed at a temperature of 400° C. or higher and lower than 750° C., preferably, 425° C. or higher and lower than 750° C. Note that in the case of the temperature of 425° C. or higher and lower than 750° C., the heat treatment time may be one hour or shorter, whereas in the case of the temperature lower than 425° C., the heat treatment time is longer than one hour. Here, the substrate is put into an electric furnace which is one of heat treatment apparatuses and heat treatment is performed on the oxide semiconductor layers in a nitrogen atmosphere. After that, the oxide semiconductor layers are not exposed to air and water and hydrogen are prevented from being mixed into the oxide semiconductor layers again. In this embodiment, slow cooling is performed from the heating temperature T at which the oxide semiconductor layers are subjected to dehydration or dehydrogenation to a temperature low enough to prevent water from entering again, specifically to a temperature that is lower than the heating temperature T by 100° C. or more, in a nitrogen atmosphere and in one furnace. Moreover, without limitation to a nitrogen atmosphere, dehydration or dehydrogenation is performed in helium, neon, argon, or the like.

Note that the heat treatment apparatus is not limited to an electric furnace, and an apparatus may be provided with a device for heating an object by heat conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which hardly reacts with the object by heat treatment is used. For example, nitrogen or a rare gas such as argon is used.

When the oxide semiconductor layers are subjected to heat treatment at 400° C. or higher and lower than 750° C., the dehydration or dehydrogenation of the oxide semiconductor layers can be achieved; thus, water ($H_2O$) can be prevented from being contained again in the oxide semiconductor layers in later steps.

Note that in the first heat treatment, it is preferable that water, hydrogen, or the like be not contained in nitrogen or a rare gas such as helium, neon, or argon. In the first heat treatment, nitrogen or a rare gas such as helium, neon, or argon which is introduced into the heat treatment apparatus preferably has a purity of 6N (99.9999%) or more, more preferably 7N (99.99999%) or more (i.e., the impurity concentration is preferably 1 ppm or less, more preferably 0.1 ppm or less).

Note that the oxide semiconductor layers become microcrystalline layers or polycrystalline layers by crystallization in some cases, depending on conditions of the first heat treatment or a material of the oxide semiconductor layers. For example, the oxide semiconductor layers may crystallize to become microcrystalline semiconductor layers having a crystallinity of 90% or more, or 80% or more. Further, depending on conditions of the first heat treatment and a material of the oxide semiconductor layers, the oxide semiconductor layers may become amorphous oxide semiconductor layers containing no crystalline component.

The oxide semiconductor layers are changed into oxygen-deficient and low-resistance oxide semiconductor layers, i.e., n-type low-resistance oxide semiconductor layers, after the first heat treatment. An oxide semiconductor layers after the first heat treatment have a higher carrier concentration than the oxide semiconductor layers shortly after the formation and preferably have a carrier concentration of $1 \times 10^{18}/cm^3$ or more.

Note that the gate electrodes 211a to 211c may be crystallized into microcrystalline layers or polycrystalline layers depending on the conditions of the first heat treatment or the material of the gate electrodes. For example, in the case where indium oxide-tin oxide alloy layers are used as the gate electrodes 211a to 211c, the gate electrodes 211a to 211c are crystallized by the first heat treatment at 450° C. for one hour, but in the case where indium oxide-tin oxide alloy layers containing silicon oxide are used as the gate electrodes 211a to 211c, the gate electrodes 211a to 211c are not crystallized.

The first heat treatment of the oxide semiconductor layer may be performed on the oxide semiconductor film before being processed into the island-shaped oxide semiconductor layers. In that case, after the first heat treatment, the substrate is taken out of the heat treatment apparatus and subjected to the photolithography step.

Then, a conductive film for forming source electrodes and drain electrodes of transistors is formed over the gate insulating layer 202 and the oxide semiconductor layers 223a to 223c.

For the conductive film, an element selected from Ti, Mo, W, Al, Cr, Cu, and Ta, an alloy containing any of these elements as a component, an alloy containing any of these elements in combination, or the like is used. The conductive film is not limited to a single layer containing any of these elements and may be a stack of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a titanium film, a titanium nitride film may be used.

Note that in the case of performing heat treatment at 200° C. to 600° C., the conductive film preferably has heat resistance so as to be able to withstand this heat treatment. For example, it is preferable to use an aluminum alloy to which an element which prevents hillocks is added, or a conductive film stacked with a heat-resistance conductive film. Note that as a method for forming the conductive film, a sputtering method, a vacuum evaporation method (an electron beam evaporation method or the like), an arc discharge ion plating method, or a spray method is used. Alternatively, the conductive film may be formed by discharging a conductive nanopaste of silver, gold, copper, or the like by a screen printing method, an ink-jet method, or the like and then baking the nanopaste.

Figure 5C:
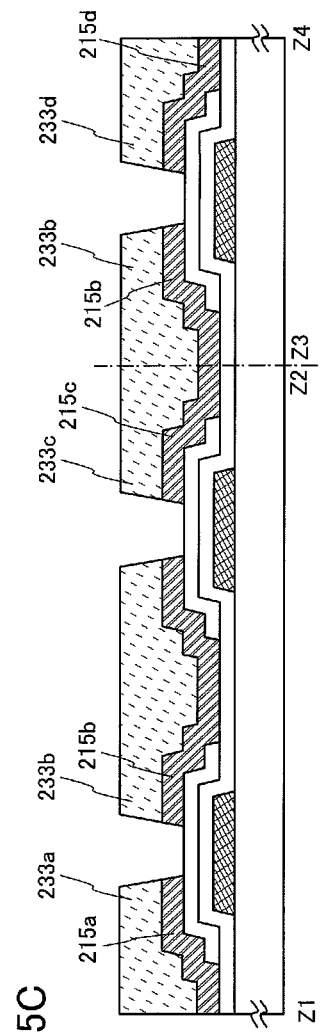

Then, a third photolithography step is performed in which a resist mask 233a, a resist mask 233b, a resist mask 233c, and a resist mask 233d are formed over the conductive film for forming source electrodes and drain electrodes of transistors, and the conductive film is partly etched using the resist masks 233a to 233d to form the conductive layer 215a, the conductive layer 215b, the conductive layer 215c, and the conductive layer 215d (see FIG. 5C).

In the third photolithography step, only the conductive film which is on and in contact with the oxide semiconductor layer is selectively removed. For example, when an ammonia peroxide mixture (at a composition weight ratio of hydrogen peroxide:ammonia:water=5:2:2) or the like is used as an alkaline etchant in order to selectively remove only portions of the metal conductive film which are on and in contact with the In—Ga—Zn—O-based oxide semiconductor layers, the metal conductive film can be selectively removed and the oxide semiconductor layers formed of an oxide semiconductor can be left.

Although it depends on the etching conditions, exposed regions of the oxide semiconductor layers may be etched in the third photolithography step. In that case, the oxide semiconductor layer is thinner in a region sandwiched between the source electrode layer and the drain electrode layer (a region sandwiched between the conductive layer 215a and the conductive layer 215b) than in a region covered with the source electrode layer or the drain electrode layer over the gate electrode 211a. In addition, the oxide semiconductor layer is thinner in a region sandwiched between the source electrode layer and the drain electrode layer (a region sandwiched between the conductive layer 215b and the conductive layer 215c) than in a region covered with the source electrode layer or the drain electrode layer over the gate electrode 211b. In addition, the oxide semiconductor layer is thinner in a region sandwiched between the source electrode layer and the drain electrode layer (a region sandwiched between the conductive layer 215b and the conductive layer 215d) than in a region covered with the source electrode layer or the drain electrode layer over the gate electrode 211c.

Then, the oxide insulating layer 207 is formed over the gate insulating layer 202, the oxide semiconductor layer 223a, the oxide semiconductor layer 223b, and the oxide semiconductor layer 223c. At this stage, parts of the oxide semiconductor layers 223a to 223c are in contact with the oxide insulating layer 207. Note that a region of the oxide semiconductor layer which overlaps with the gate electrode with the gate insulating layer interposed therebetween is a channel formation region.

The oxide insulating layer 207 can be formed with a thickness at least 1 nm by a method by which impurities such as water or hydrogen is not mixed into the oxide insulating layer; for example, a sputtering method may be employed as appropriate. In this embodiment, a silicon oxide film is formed as the oxide insulating layer by a sputtering method. The substrate temperature in film formation may be room temperature to 300° C. inclusive. In this embodiment, the substrate temperature is 100° C. The silicon oxide film can be formed by a sputtering method in a rare gas (typically, argon) atmosphere, an oxygen atmosphere, or a mixed atmosphere including a rare gas (typically, argon) and oxygen. As a target, a silicon oxide target or a silicon target can be used. For example, with use of a silicon target, a silicon oxide film can be formed by a sputtering method in an atmosphere of oxygen and a rare gas. As the oxide insulating layer which is formed in contact with the oxide semiconductor layers 223a to 223d, an inorganic insulating film which does not include impurities such as moisture, a hydrogen ion, or OH⁻ and blocks entry of these from the outside is used. Specifically, a silicon oxide film, a silicon nitride oxide film, an aluminum oxide film, or an aluminum oxynitride film is used. Note that an oxide insulating layer formed by a sputtering method is distinctively dense and even a single layer thereof can be used as a protective film for suppressing a phenomenon in which impurities are diffused into a layer in contact with the oxide insulating layer. In addition, a target doped with phosphorus (P) or boron (B) can be used so that phosphorus (P) or boron (B) is added to the oxide insulating layer.

In this embodiment, the oxide insulating layer is formed by a pulsed DC sputtering method using a columnar polycrystalline, boron-doped silicon target which has a purity of 6N (the resistivity is 0.01 Ωcm), in which the distance between the substrate and the target (T-S distance) is 89 mm, the pressure is 0.4 Pa, the direct-current (DC) power source is 6 kW, and the atmosphere is oxygen (the proportion of the oxygen flow is 100%). The film thickness is 300 nm.

The oxide insulating layer 207 is provided on and in contact with the channel formation region in the oxide semiconductor layer and also serves as a channel protective layer.

Next, second heat treatment (preferably, at 200° C. to 400° C. inclusive, for example, at 250° C. to 350° C. inclusive) may be performed in an inert gas atmosphere or in a nitrogen gas atmosphere. For example, the second heat treatment is performed at 250° C. for one hour in a nitrogen atmosphere. By the second heat treatment, portions of the oxide semiconductor layers 223a to 223c are heated while being in contact with the oxide insulating layer 207, and other portions of the oxide semiconductor layers 223a to 223c are heated while being in contact with the conductive layers 215a to 215d.

When the oxide semiconductor layers 223a to 223c whose resistance has been lowered by the first heat treatment are subjected to the second heat treatment while being in contact with the oxide insulating layer 207, regions in contact with the oxide insulating layer 207 are brought into oxygen-excess state. As a result, the oxide semiconductor layers 223a to 223c are changed into i-type oxide semiconductor layers (high-resistance oxide semiconductor layers) in the depth direction from the regions in contact with the oxide insulating layer 207 (see FIG. 6A).

Note that the timing of the second heat treatment is not limited to the timing shortly after the third photolithography step as long as it is after the third photolithography step.

Then, the planarization insulating layer 216 is formed over the oxide insulating layer 207. The planarization insulating layer 216 can be formed of a heat-resistant organic material, such as polyimide, acrylic, polyimide amide, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed of any of these materials.

Note that the siloxane-based resin is a resin including a Si—O—Si bond formed using a siloxane-based material as a starting material. The siloxane-based resin may include an organic group (e.g., an alkyl group or an aryl group) or a fluoro group as a substituent. The organic group may contain a fluoro group.

There is no particular limitation on the method of forming the planarizing insulating layer 216. Depending on the material, the planarizing insulating layer 216 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like.

After the resist masks are removed, a light-transmitting conductive film is formed. The light-transmitting conductive film is formed of indium oxide ($In_2O_3$), an indium oxide-tin oxide alloy ($In_2O_3$—$SnO_2$, abbreviated as ITO), or the like by a sputtering method, a vacuum evaporation method, or the like. Alternatively, an Al—Zn—O-based film including nitrogen, that is, an Al—Zn—O—N-based film, a Zn—O—N-based film including nitrogen, or a Sn—Zn—O-based film including nitrogen may be used. Note that the proportion (atomic %) of zinc in the Al—Zn—O—N-based film is 47 atomic % or lower and is higher than that of aluminum in the Al—Zn—O—N-based film; the proportion (atomic %) of aluminum in the Al—Zn—O—N-based film is higher than that of nitrogen in the Al—Zn—O—N-based film. Such a material is etched with a hydrochloric acid-based solution. However, since a residue is easily generated particularly in etching of ITO, an indium oxide-tin oxide alloy ($In_2O_3$—ZnO) may be used to improve etching processability.

Note that the unit of the proportion of the components in the light-transmitting conductive film is atomic percent, and the proportion of the components is evaluated by analysis using an electron probe X-ray microanalyzer (EPMA).

Then, a fourth photolithography step is performed in which a resist mask is formed and an unnecessary portion of the conductive film is etched away to form the conductive layers 217a to 217c (see FIG. 6B.).

Through the above steps, a driver circuit portion can be manufactured.

In the manufacturing method of the driver circuit portion described with reference to FIGS. 5A to 5C and FIGS. 6A and 6B, the depletion type transistor and the enhancement type transistor in a logic circuit in the driver circuit, and the depletion type transistor, which is a switching element for discharging charge if charge builds up in a signal line or an element, electrode, or wiring which is electrically connected to the signal line, can be manufactured by the same steps.

Note that in the manufacturing method of the driver circuit portion described with reference to FIGS. 5A to 5C and FIGS. 6A and 6B, a resist mask may be formed by an ink jetting method. Formation of the resist mask by an ink jetting method does not use a photomask; thus, manufacturing cost can be reduced.

Note that this embodiment can be combined as appropriate with any of the other embodiments.

Embodiment 3

In this embodiment, another example of a structure of the driver circuit portion in Embodiment 1 will be described.

Figure 7A:
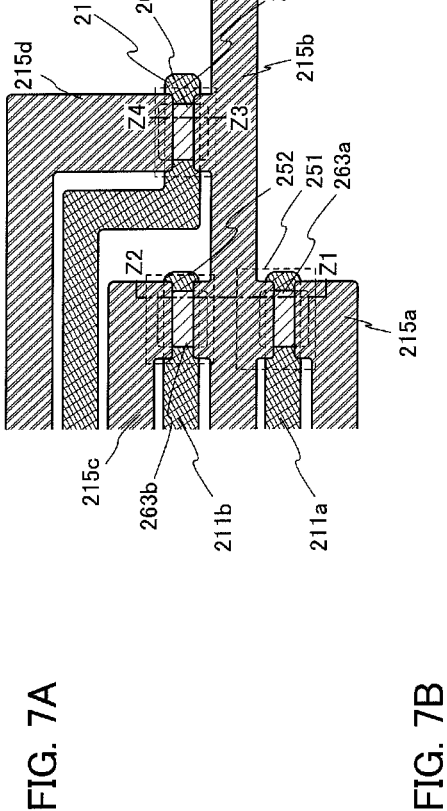
FIGS. 7A and 7B illustrate an example of a structure of a display device according to Embodiment 2.
Figure 7B:
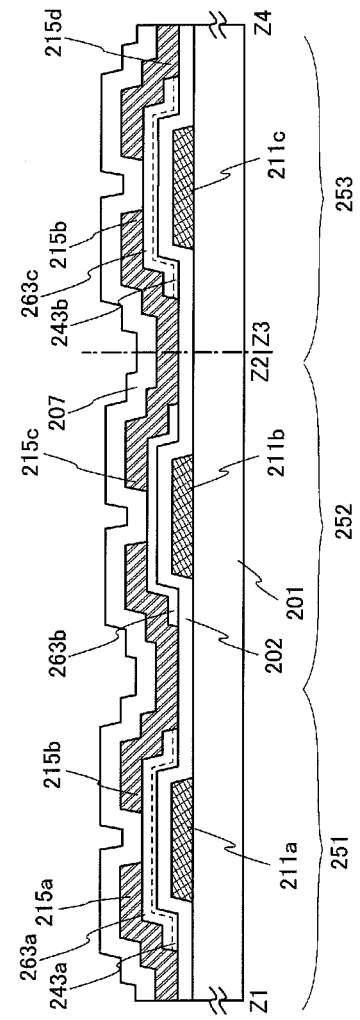

An example of a structure of the driver circuit portion of this embodiment will be described with reference to FIGS. 7A and 7B. FIGS. 7A and 7B illustrate an example of the structure of the driver circuit portion in this embodiment. FIG. 7A is a top view and FIG. 7B is a cross-sectional view taken along line Z1-Z2 and line Z3-Z4 of FIG. 7A.

The driver circuit portion illustrated in FIGS. 7A and 7B includes, like the driver circuit portion illustrated in FIGS. 2A and 2B, the transistor 251, the transistor 252, and the transistor 253 over the substrate 201.

The transistor 251 and the transistor 252 are examples of an element used in a logic circuit in the driver circuit 111 illustrated in FIG. 1 and the equivalent circuit diagram of the transistors is illustrated in FIG. 3; therefore, a description thereof is omitted here. The transistor 253 corresponds to the transistor 112 illustrated in FIG. 1. Next, structures of the transistors will be described.

The transistor 251 includes the gate electrode 211a over the substrate 201, the gate insulating layer 202 over the gate electrode 211a, an oxide semiconductor layer 243a over the gate electrode 211a with the gate insulating layer 202 interposed therebetween, an oxide semiconductor layer 263a over the oxide semiconductor layer 243a, and the conductive layer 215a and the conductive layer 215b over parts of the oxide semiconductor layer 263a.

The transistor 252 includes the gate electrode 211b over the substrate 201, the gate insulating layer 202 over the gate electrode 211b, the oxide semiconductor layer 263b over the gate electrode 211b with the gate insulating layer 202 interposed therebetween, the conductive layer 215b and the conductive layer 215c over parts of the oxide semiconductor layer 263b.

The transistor 253 includes the gate electrode 211c over the substrate 201, the gate insulating layer 202 over the gate electrode 211c, an oxide semiconductor layer 243b over the gate electrode 211c with the gate insulating layer 202 interposed therebetween, an oxide semiconductor layer 263c over the oxide semiconductor layer 243b, and the conductive layer 215b and the conductive layer 215d over parts of the oxide semiconductor layer 263c.

Each of the conductive layers 215a to 215d serves as a source electrode or a drain electrode.

The oxide semiconductor layer 243a, the oxide semiconductor layer 243b, and the oxide semiconductor layers 263a to 263c are subjected to dehydration or dehydrogenation and an oxide insulating layer 207 is formed in contact with the oxide semiconductor layers 263a to 263c. A transistor including such an oxide semiconductor layer as a channel formation layer has high reliability because a V-th shift due to a long-term use or high load hardly occurs.

Note that a nitride insulating layer may be provided over the oxide insulating layer 207. It is preferable that the nitride insulating layer be in contact with the gate insulating layer 202 or an insulating layer serving as a base which is provided below the oxide insulating layer 207 so as to block entry of impurities such as moisture, hydrogen ions, and OH⁻ from the vicinity of a side surface of the substrate. It is particularly effective to use a silicon nitride layer as the gate insulating layer 202 or the insulating layer serving as the base, which is in contact with the oxide insulating layer 207. In other words, when the silicon nitride layers are provided over, under, and around the oxide semiconductor layer so as to surround the oxide semiconductor layer, the reliability of the display device is improved.

A planarizing insulating layer can be provided over the oxide insulating layer 207 (over the nitride insulating layer if provided).

Over the oxide insulating layer 207 (over the nitride insulating layer if the nitride insulating layer is provided and the planarizing insulating layer is not provided, or over the planarizing insulating layer if the planarizing insulating layer is provided), a first conductive layer to a third conductive layer may be provided: the first conductive layer may overlap with the oxide semiconductor layer 243a and the oxide semiconductor layer 263a with the oxide insulating layer 207 interposed therebetween; the second conductive layer may overlap with the oxide semiconductor layer 263b with the oxide insulating layer 207 interposed therebetween; and the third conductive layer may overlap with the oxide semiconductor layer 243b and the oxide semiconductor layer 263c with the oxide insulating layer 207 interposed therebetween. Each of the first to third conductive layers serves as a second gate electrode. The same or different second gate voltages are applied to the first to third conductive layers, whereby the threshold voltages of the transistors 251 to 253 can be controlled.

The thickness of the oxide semiconductor layer (a stack of the oxide semiconductor layer 243a and the oxide semiconductor layer 263a) in the transistor 251 is larger than the thickness of the oxide semiconductor layer (the oxide semiconductor layer 263b) in the transistor 252. In addition, the thickness of the oxide semiconductor layer (a stack of the oxide semiconductor layer 243b and the oxide semiconductor layer 263c) in the transistor 253 is larger than the thickness of the oxide semiconductor layer (the oxide semiconductor layer 263b) in the transistor 252. As the thickness of the oxide semiconductor layer increases, the absolute value of a negative voltage for the gate electrode which is needed to fully deplete the oxide semiconductor layer and to bring the transistor into an off state increases. As a result, a transistor including a thick oxide semiconductor layer as a channel formation layer behaves as a depletion type transistor.

As illustrated in the example in FIGS. 7A and 7B, the display device of this embodiment can include, by adjusting the thicknesses of the oxide semiconductor layers, a driver circuit including a depletion type transistor and an enhancement type transistor, and a depletion type transistor for discharging charge if charge builds up in a signal line or an element, electrode, or wiring which is electrically connected to the signal line, over one substrate. Thus, charge build-up can be reduced. In addition, when a display device is formed using a bottom gate transistor, if charge builds up in a back channel portion, the built up charge can be discharged to the reference voltage line through a signal line. Consequently, generation of a parasitic channel can be suppressed and leakage current can be reduced.

Figure 8:
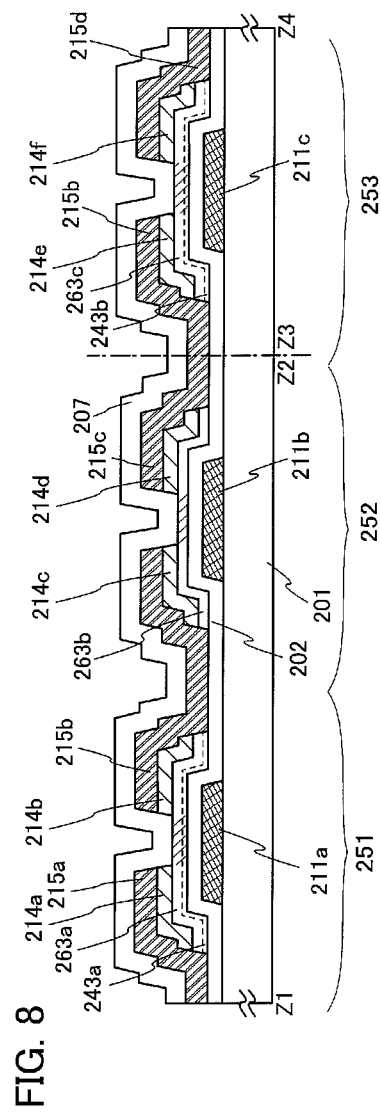
FIG. 8 illustrates an example of a structure of a display device according to Embodiment 2.

Alternatively, the display device of this embodiment may have a structure illustrated in FIG. 8. In the structure, an oxide conductive layer 214a and an oxide conductive layer 214b which serve as a pair of buffer layers are provided over the oxide semiconductor layer 263a, and the conductive layer 215a and the conductive layer 215b which serve as a pair of electrodes are provided in contact with the oxide conductive layer 214a and the oxide conductive layer 214b in the transistor 251; an oxide conductive layer 214c and an oxide conductive layer 214d which serve as a pair of buffer layers are provided over the oxide semiconductor layer 263b, and the conductive layer 215b and the conductive layer 215c which serve as a pair of electrodes are provided in contact with the oxide conductive layer 214c and the oxide conductive layer 214d in the transistor 252; and an oxide conductive layer 214e and an oxide conductive layer 214f which serve as a pair of buffer layers are provided over the oxide semiconductor layer 263c, and the conductive layer 215b and the conductive layer 215d which serve as a pair of electrodes are provided in contact with the oxide conductive layer 214e and the oxide conductive layer 214f in the transistor 253.

Each of the oxide conductive layers 214a to 214f has higher conductivity than the oxide semiconductor layers 243a and 243b, and the oxide semiconductor layers 263a to 263c, and serves as a source region or a drain region of the transistors 251 to 253.

As an oxide conductive film which is used for forming the oxide conductive layers 214a to 214f, a film of a conductive material that transmits visible light, such as an In—Sn—O-based, In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—O-based, Sn—O-based, or Zn—O-based metal oxide may be used. The thickness of the oxide conductive film is set within the range of 1 nm to 300 nm inclusive, as appropriate. In the case of using a sputtering method, it is preferable that film formation be performed with a metal oxide target including SiO$_2$ at 2 wt % to 10 wt % inclusive so that SiO$_x$ (x>0) which inhibits crystallization is included in the light-transmitting conductive film so that the light-transmitting conductive film may be prevented from being crystallized in heat treatment performed later for dehydration or dehydrogenation.

Further, if an In—Ga—Zn—O-based film is used as the oxide semiconductor layer and the oxide conductive layer, for example, the oxide semiconductor layer 243a, the oxide semiconductor layer 243b, and the oxide semiconductor layers 263a to 263c which serve as channel formation layers and the oxide conductive layers 214a to 214f which serve as source regions and drain regions can be separately formed under different film formation conditions.

For example, in the case of film formation by a sputtering method, the oxide conductive layers 214a to 214f, which are formed using an oxide semiconductor film formed in an argon gas, have n-type conductivity and have activation energy (ΔE) of 0.01 eV to 0.1 eV inclusive.

Note that in this embodiment, the oxide conductive layers 214a to 214f are In—Ga—Zn—O-based films and include at least amorphous components. Moreover, the oxide conductive layers 214a to 214f may include crystal grains (nanocrystals). In that case, the crystal grains (nanocrystals) in the oxide conductive layers 214a to 214f have a diameter of approximately 1 nm to 10 nm, typically approximately 2 nm to 4 nm.

The oxide conductive layers 214a to 214f are not necessarily provided, but if the oxide conductive layers 214a to 214f are provided between the oxide semiconductor layer 243a, the oxide semiconductor layer 243b, and the oxide semiconductor layers 263a to 263c serving as channel formation layers and the conductive layers 215a to 215d serving as source electrodes and drain electrodes, good electrical junctions can be obtained and the transistors 251 to 253 can operate stably. Moreover, high mobility can be maintained at a high drain voltage.

Figure 9A:
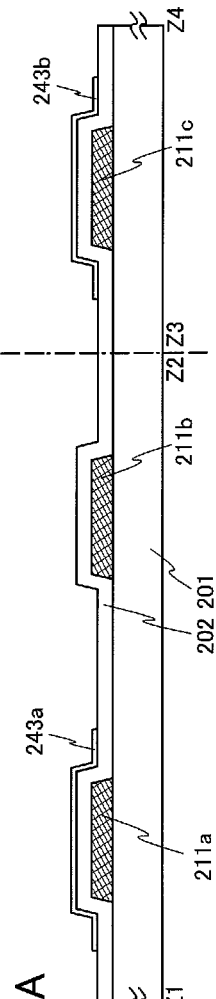
FIGS. 9A to 9C are cross-sectional views illustrating an example of a manufacturing method of the display device in FIGS. 7A and 7B.
Figure 9B:
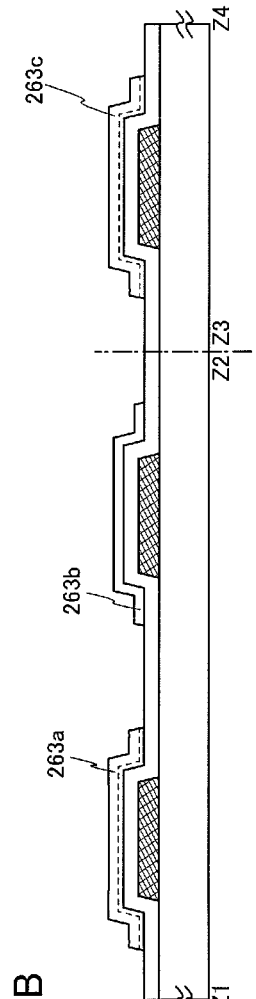
Figure 9C:
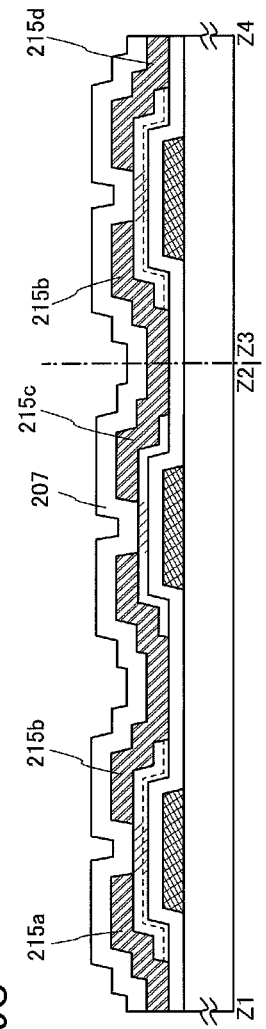

Then, an example of a manufacturing method of the driver circuit portion illustrated in FIGS. 7A and 7B will be described with reference to FIGS. 9A to 9C. FIGS. 9A to 9C are cross-sectional views of an example of a manufacturing method of the driver circuit portion illustrated in FIGS. 7A and 7B.

First, as in the steps illustrated in FIG. 5A, the substrate 201 is prepared and a conductive film is formed over the substrate 201, then a first photolithography step is performed in which a resist mask is formed over parts of the conductive film and the conductive film is etched using the resist mask to form the gate electrodes 211a to 211c.

Then, the resist mask is removed. The gate insulating layer 202 is formed over the gate electrodes 211a to 211c. Oxide semiconductor layers having different thicknesses are formed over the gate insulating layer 202. In this embodiment, a thick oxide semiconductor layer is formed over the gate electrode 211a with the gate insulating layer 202 interposed therebetween, a thin oxide semiconductor layer is formed over the gate electrode 211b with the gate insulating layer 202 interposed therebetween, and a thick oxide semiconductor layer is formed over the gate electrode 211c with the gate insulating layer 202 interposed therebetween. Note that in this embodiment, a method for forming an oxide semiconductor film to overlap with island-shaped oxide semiconductor layers is described as an example of a method for forming a thick oxide semiconductor layer over the gate electrode 211a and the gate electrode 211c with the gate insulating layer 202 interposed between the thick oxide semiconductor layers and the gate electrodes.

First, a first oxide semiconductor film is formed. As the first oxide semiconductor film, any of the following can be used: an In—Ga—Zn—O-based film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film. The first oxide semiconductor film can be formed by a sputtering method in a rare gas (typically, argon) atmosphere, an oxygen atmosphere, or a mixed atmosphere including a rare gas (typically, argon) and oxygen. In the case of using a sputtering method, it is preferable that a film be formed with a target including SiO$_2$ at 2 wt % to 10 wt % inclusive so that SiO$_x$ (x>0) which inhibits crystallization is included in the oxide semiconductor film so that crystallization of oxide semiconductor layers which are to be formed later may be suppressed in heat treatment performed later for dehydration or dehydrogenation.

The oxide semiconductor is preferably an oxide semiconductor containing In, more preferably an oxide semiconductor containing In and Ga. In order to make an oxide semiconductor layer i-type (intrinsic), dehydration or dehydrogenation is effective.

Here, the oxide semiconductor film is formed with use of an oxide semiconductor target including In, Ga, and Zn (at a composition ratio of In$_2$O$_3$:Ga$_2$O$_3$:ZnO=1:1:1 [molar ratio]), under conditions where the distance between the substrate and the target is 100 mm, the pressure is 0.6 Pa, the direct current (DC) power supply is 0.5 kW, and the atmosphere is oxygen (the proportion of the oxygen flow is 100%). Note that a pulse direct current (DC) power supply is preferable because powdery substances which are generated at the time of the film formation can be reduced and the film thickness can be made uniform. In this embodiment, an In—Ga—Zn—O-based film is formed using an In—Ga—Zn—O-based oxide semiconductor target by a sputtering method as the first oxide semiconductor film.

In this embodiment, the oxide semiconductor film is formed such that the total thickness of the first oxide semiconductor film and the second oxide semiconductor film thereover is in the range of 50 nm to 100 nm inclusive. Note that an appropriate thickness differs depending on an oxide semiconductor material, and the thickness may be set as appropriate depending on the material.

Note that before the first oxide semiconductor film is formed by a sputtering method, powdery substances which are generated at the time of the film formation and attached to a surface of the gate insulating layer 202 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate so that a surface may be modified. Note that instead of an argon atmosphere, nitrogen, helium, oxygen, or the like may be used.

Then, by a second photolithography step, a resist mask is formed over parts of the first oxide semiconductor film and the first oxide semiconductor film is etched using the resist mask, whereby the first oxide semiconductor film is processed into islands to form the oxide semiconductor layer 243a and the oxide semiconductor layer 243b (see FIG. 9A).

Note that after the second photolithography step, it is preferable that the oxide semiconductor layer 243a and the oxide semiconductor layer 243b be subjected to heat treatment (at 400° C. or higher and lower than 750° C.) in an inert gas atmosphere (such as nitrogen, helium, neon, or argon) in order to remove impurities such as hydrogen and water from the layer, and then a second oxide semiconductor film be formed.

Then, the resist mask is removed. A second oxide semiconductor film is formed. For the second oxide semiconductor film, a material which is the same as the material of the first oxide semiconductor film can be used. In this embodiment, an In—Ga—Zn—O-based film is formed. The second oxide semiconductor film preferably has a thickness of 5 nm to 30 nm inclusive. Note that an appropriate thickness differs depending on an oxide semiconductor material, and the thickness may be set as appropriate depending on the material.

Over the gate electrode 211a, the second oxide semiconductor film is formed over the oxide semiconductor layer 243a, and thus a thick oxide semiconductor layer is formed. On the other hand, over the gate electrode 211b, the second oxide semiconductor film is formed in contact with the gate insulating layer 202, and thus a thin oxide semiconductor layer is formed. Further, over the gate electrode 211c, the second oxide semiconductor film is formed over the oxide semiconductor layer 243b, and thus a thick oxide semiconductor layer is formed.

Then, by a third photolithography step, a resist mask is formed over parts of the second oxide semiconductor film and the second oxide semiconductor film is etched using the resist mask, whereby the second oxide semiconductor film is processed into islands. An island-shaped thick oxide semiconductor layer in which the oxide semiconductor layer 243a and the oxide semiconductor layer 263a are stacked is formed over the gate electrode 211a. An island-shaped thick oxide semiconductor layer in which the oxide semiconductor layer 243b and the oxide semiconductor layer 263c are stacked is formed over the gate electrode 211c. In addition, the oxide semiconductor layer 263c is formed over the gate electrode 211b (see FIG. 9B).

Then, the resist mask is removed, and the oxide semiconductor layers are subjected to dehydration or dehydrogenation. First heat treatment for dehydration or dehydrogenation is performed at a temperature of 400° C. or higher and lower than 750° C., preferably, 425° C. or higher and lower than 750° C. Note that in the case of the temperature of 425° C. or higher and lower than 750° C., the heat treatment time may be one hour or shorter, whereas in the case of the temperature lower than 425° C., the heat treatment time is longer than one hour. Here, the substrate over which the oxide semiconductor layers are formed is put into an electric furnace which is one of heat treatment apparatuses and heat treatment is performed on the oxide semiconductor layers in a nitrogen atmosphere. After that, the oxide semiconductor layers are not exposed to air and water and hydrogen are prevented from being mixed into the oxide semiconductor layers again. In this embodiment, slow cooling is performed from the heating temperature T at which the oxide semiconductor layers are subjected to dehydration or dehydrogenation to a temperature low enough to prevent water from entering again, specifically to a temperature that is lower than the heating temperature T by 100° C. or more, in a nitrogen atmosphere and in one furnace. Moreover, without limitation to a nitrogen atmosphere, dehydration or dehydrogenation is performed in a rare gas atmosphere such as helium, neon, or argon.

Note that the heat treatment apparatus is not limited to an electric furnace, and, for example, an RTA (rapid thermal annealing) apparatus such as a GRTA (gas rapid thermal annealing) apparatus or an LRTA (lamp rapid thermal annealing) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus with which a gas is heated through thermal radiation of light emitted from the above lamp and by light emitted from the lamp and the object is heated by heat conduction from the heated gas. As the gas, an inert gas which does not react with the object to be processed by heat treatment, for example, nitrogen or a rare gas such as argon, is used. In addition, the LRTA apparatus and the GRTA apparatus may be provided with not only a lamp but also a device which heats the object by heat conduction or thermal radiation from a heater such as a resistance heater.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or less, more preferably 0.1 ppm or less).

Note that the oxide semiconductor layers become microcrystalline layers or polycrystalline layers by crystallization in some cases, depending on conditions of the first heat treatment or a material of the oxide semiconductor layers. For example, the oxide semiconductor layers may crystallize to become microcrystalline semiconductor layers having a crystallinity of 90% or more, or 80% or more. Further, depending on conditions of the first heat treatment and a material of the oxide semiconductor layers, the oxide semiconductor layers may become amorphous oxide semiconductor layers containing no crystalline component.

The oxide semiconductor layers are changed into oxygen-deficient and low-resistance oxide semiconductor layers, i.e., n-type low-resistance oxide semiconductor layers, after the first heat treatment. An oxide semiconductor layers after the first heat treatment have a higher carrier concentration than the oxide semiconductor layers shortly after the formation and preferably have a carrier concentration of $1 \times 10^{18}/cm^3$ or more.

Note that the gate electrode 211a, the gate electrode 211b, and the gate electrode 211c may be crystallized into microcrystalline layers or polycrystalline layers depending on the conditions of the first heat treatment or the material of the gate electrodes. For example, in the case where indium oxide-tin oxide alloy layers are used as the gate electrode 211a, the gate electrode 211b, and the gate electrode 211c, they are crystallized by the first heat treatment at 450° C. for one hour, but in the case where indium oxide-tin oxide alloy layers containing silicon oxide are used as the gate electrode 211a, the gate electrode 211b, and the gate electrode 211c, they are not crystallized.

The first heat treatment of the oxide semiconductor layer may be performed on the oxide semiconductor film before being processed into the island-shaped oxide semiconductor layers. In that case, after the first heat treatment, the substrate is taken out of the heat treatment apparatus and subjected to the photolithography step.

Then, as in the steps illustrated in FIG. 5C, a conductive film for forming source electrodes and drain electrodes of transistors is formed over the gate insulating layer 202 and the oxide semiconductor layers 263a to 263c. A third photolithography step is performed in which a resist mask is formed over parts of the conductive film, and the conductive film is etched using the resist mask to form the conductive layers 215a to 215d. The resist mask is removed. Then, the oxide insulating layer 207 is formed over the gate insulating layer 202 and the oxide semiconductor layers 263a to 263c. At this stage, parts of the oxide semiconductor layers 263a to 263c are in contact with the oxide insulating layer 207.

Note that, after the formation of the oxide insulating layer 207, second heat treatment (preferably, at 200° C. to 400° C. inclusive, for example, at 250° C. to 350° C. inclusive) may be performed in an inert gas atmosphere or in a nitrogen gas atmosphere. For example, the second heat treatment is performed at 250° C. for one hour in a nitrogen atmosphere. By the second heat treatment, portions of the oxide semiconductor layers 263a to 263c are heated while being in contact with the oxide insulating layer 207, and other portions of the oxide semiconductor layers 263a to 263c are heated while being in contact with the conductive layers 215a to 215d.

When the oxide semiconductor layers 263a to 263c whose resistance has been lowered by the first heat treatment are subjected to the second heat treatment while being in contact with the oxide insulating layer 207, regions in contact with the oxide insulating layer 207 are brought into an oxygen-excess state. As a result, the oxide semiconductor layers 263a to 263c are changed into i-type oxide semiconductor layers (high-resistance oxide semiconductor layers) in the depth direction from the regions in contact with the oxide insulating layer 207 as in the case of FIG. 6A.

In the oxide semiconductor layer having a large thickness in which the oxide semiconductor layer 243a and the oxide semiconductor layer 263a are stacked and in the oxide semiconductor layer having a large thickness in which the oxide semiconductor layer 243b and the oxide semiconductor layer 263c are stacked, a region having i-type conductivity (having increased resistance) is formed from the interface with the oxide insulating layer 207 toward the gate insulating layer 202. However, since the stack of the oxide semiconductor layer 243a and the oxide semiconductor layer 263a and the stack of the oxide semiconductor layer 243b and the oxide semiconductor layer 263c have a large thickness, a change into i-type oxide semiconductor layers (high-resistance oxide semiconductor layers) does not proceed to the vicinity of the interface with the gate insulating layer 202, and an oxide semiconductor layer including a region whose resistance has been lowered and remains low in a channel formation region is obtained.

In this manner, the transistors included in the driver circuit portion described in this embodiment include oxide semiconductor layers as channel formation layers and the oxide semiconductor layers include an increased resistance (i-type conductivity) region in different portions. As a result, the transistors have different operating characteristics.

The transistor 251 has the thick oxide semiconductor layer as the channel formation layer and the oxide semiconductor layer includes a portion whose resistance has been lowered and remains low. Thus, the transistor 251 has a negative threshold voltage and behaves as a depletion type transistor. The transistor 252 has a thin oxide semiconductor layer which is an oxide semiconductor layer having an i-type conductivity (having increased resistance) as the channel formation layer. Thus, the transistor 252 has a positive threshold voltage and behaves as an enhancement type transistor. Further, the transistor 253 has the thick oxide semiconductor layer as the channel formation layer and the oxide semiconductor layer includes a portion whose resistance has been lowered and remains low. Thus, the transistor 253 has a negative threshold voltage and behaves as a depletion type transistor.

Note that when a region where the conductive layers 215a to 215d formed using a metal conductive film are in contact with the stack of the oxide semiconductor layer 243a and the oxide semiconductor layer 263a or the stack of the oxide semiconductor layer 243b and the oxide semiconductor layer 263c is subjected to the second heat treatment, oxygen easily moves to the metal conductive film side and the oxide semiconductor layers change into n-type. In the case where the oxide semiconductor layer has a thickness of 30 nm or more, the vicinity of the interface with the metal conductive film changes to n-type, whereas the underlying portion is i-type or becomes n-type.

Through the above steps, the driver circuit portion illustrated in FIGS. 7A and 7B can be manufactured (see FIG. 9C).

In the manufacturing method of the driver circuit portion described with reference to FIGS. 5A to 5C and FIGS. 6A and 6B, the depletion type transistor and the enhancement type transistor in a logic circuit in the driver circuit, and the depletion type transistor for discharging charge if charge builds up in a signal line or an element, electrode, or wiring which is electrically connected to the signal line can be manufactured by the same steps. In addition, even in a display device using transistors including an oxide semiconductor, leakage current can be reduced.

Note that in the manufacturing method of the driver circuit portion described with reference to FIGS. 9A to 9C, a resist mask may be formed by an ink jetting method. Formation of the resist mask by an ink jetting method does not use a photomask; thus, manufacturing cost can be reduced.

Note that this embodiment can be combined as appropriate with any of the other embodiments.

Embodiment 4

In this embodiment, a sequential logic circuit which can be applied to a driver circuit in a display device which is one embodiment of the present invention will be described.

Figure 10:
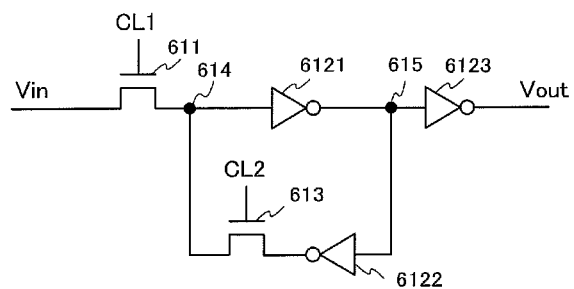
FIG. 10 is a circuit diagram illustrating an example of a circuit structure of a logic circuit according to Embodiment 3.

A circuit structure of a logic circuit including a combinational circuit will be described with reference to FIG. 10. FIG. 10 is a circuit diagram illustrating a circuit structure of the logic circuit in this embodiment.

A logic circuit illustrated in FIG. 10 includes a transistor 611, an inverter 6121, an inverter 6122, an inverter 6123, and a transistor 613.

A first clock signal (also referred to as CL1) is input to a gate of the transistor 611, and a first signal is input to one of a source and drain of the transistor 611. The signal input to one of the source and drain is referred to as an input signal and the voltage of the input signal is also referred to as Vin.

An input terminal of the inverter 6121 is electrically connected to the other of the source and drain of the transistor 611.

An input terminal of the inverter 6122 is electrically connected to an output terminal of the inverter 6121.

An input terminal of the inverter 6123 is electrically connected to the output terminal of the inverter 6121. A second signal is output from an output terminal of the inverter 6121. A signal which is output from the inverter 6123 is also referred to as an output signal and the voltage of the output signal is referred to as Vout.

The logic circuit illustrated in FIG. 3 can be applied to each of the inverters 6121 to 6123.

A second clock signal (also referred to as CL2) is input to a gate of the transistor 613. One of a source and drain of the transistor 613 is electrically connected to the other of the source and drain of the transistor 611. The other of the source and drain of the transistor 613 is electrically connected to an output terminal of the inverter 6122.

The first clock signal and the second clock signal each have two states of a high state and a low state. A voltage of the clock signal in a high state or substantially in a high state is referred to as VH and a voltage of the clock signal in a low state or substantially in a low state is referred to as VL.

The first clock signal and the second clock signal have opposite phases. For example, in a predetermined period, the second clock signal is low when the first clock signal is high, whereas the second clock signal is high when the first clock signal is low.

Note that in this embodiment, the case is described in which the first clock signal is input to the gate of the transistor 611 and the second clock signal is input to the gate of the transistor 613; however, one embodiment of the present invention is not limited thereto. A structure can be employed in which the second clock signal is input to the gate of the transistor 611 and the first clock signal is input to the gate of the transistor 613.

Figure 11:
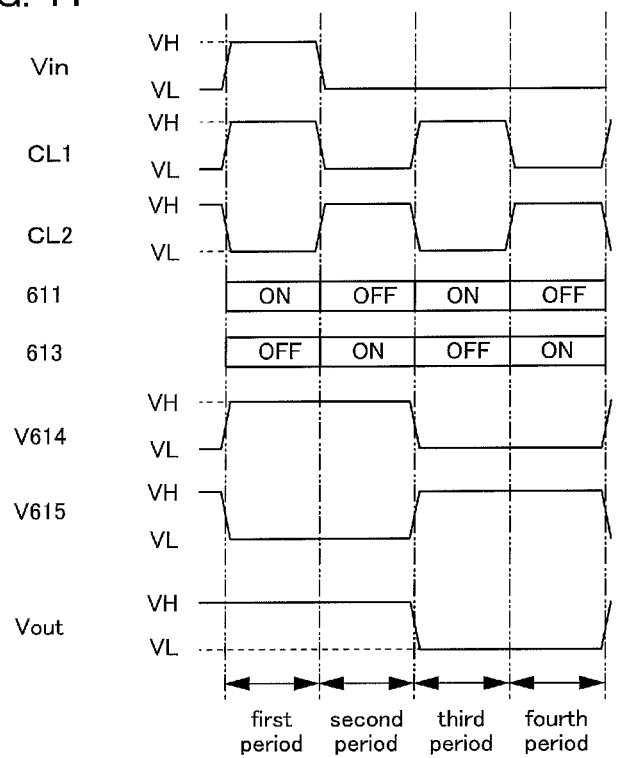
FIG. 11 is a timing diagram illustrating an example of operation of the logic circuit illustrated in FIG. 10.

Next, operation of the logic circuit illustrated in FIG. 10 will be described with reference to FIG. 11. FIG. 11 is a timing diagram illustrating the operation of the logic circuit in FIG. 10.

The operation of the logic circuit illustrated in FIG. 10 is roughly divided into four periods. Each period will be described below.

First, in a first period, as illustrated in FIG. 11, the first clock signal is high and the second clock signal is low. Accordingly, the transistor 611 is in an on state and the transistor 613 is in an off state. In addition, the input signal is high and the voltage of the input signal is VH.

At this time, since the transistor 611 is on, a voltage of a node 614 (also referred to as V614) is VH. Since the voltage of the node 614 is applied to the input terminal of the inverter 6121, a signal of VL is output from the inverter 6121, and a voltage of a node 615 (also referred to as V615) is VL. Further, since the voltage of the node 615 is applied to the input terminal of the inverter 6122, a signal of VH is output from the inverter 6122, but the voltage of the output signal from the inverter 6122 is not applied to the node 614 because the transistor 613 is in an off state. The potential of the node 615 is also applied to the input terminal of the inverter 6123, and therefore a signal of VH is output from the inverter 6123. The above is the operation in the first period.

Then, in a second period, as illustrated in FIG. 11, the first clock signal is low and the second clock signal is high. Accordingly, the transistor 611 is in an off state and the transistor 613 is in an on state. In addition, the input signal is low.

At this time, since the transistor 611 is in an off state, V614 is kept at VH even when the input signal is low. Since the potential of the node 614 is applied to the input terminal of the inverter 6121, a signal of VL is output from the inverter 6121, and V615 is kept at VL. Further, the potential of the node 615 is applied to the input terminal of the inverter 6122, and a signal of VH is output from the inverter 6122. Moreover, since the transistor 613 is in an on state, the potential of the signal from the inverter 6122 is applied to the node 614. The potential of the node 615 is also applied to the input terminal of the inverter 6123, and therefore a signal of VH is output from the inverter 6123. The above is the operation in the second period.

Then, in a third period, as illustrated in FIG. 11, the first clock signal is high and the second clock signal is low. Accordingly, the transistor 611 is in an on state and the transistor 613 is in an off state. In addition, Vin is kept at VL.

At this time, since the transistor 611 is in an on state, V614 is VL. Since the potential of the node 614 is applied to the input terminal of the inverter 6121, a signal of VH is output from the inverter 6121, and V615 is VH. Further, since the potential of the node 615 is applied to the input terminal of the inverter 6122, a signal of VL is output from the inverter 6122, but the voltage of the output signal from the inverter 6122 is not applied to the node 614 because the transistor 613 is in an off state. Moreover, the voltage of the node 615 is also applied to the input terminal of the inverter 6123, so that a signal of VL is output from the inverter 6123. The above is the operation in the third period.

Then, in a fourth period, as illustrated in FIG. 11, the first clock signal is low and the second clock signal is high. Accordingly, the transistor 611 is in an off state and the transistor 613 is in an on state. In addition, Vin is kept at VL.

At this time, since the transistor 611 is in an off state, V614 is kept at VL. When V614 is VL, a signal of VH is output from the inverter 6121, and V615 is kept at VH. Further, when V615 is VH, a signal of VL is output from the inverter 6122, and since the transistor 613 is in an on state, the voltage of the signal from the inverter 6122 is applied to the node 614. Moreover, the voltage of the node 615 is also applied to the input terminal of the inverter 6123, and therefore a signal of VL is output from the inverter 6123. The above is the operation in the fourth period.

Through the above operation, the logic circuit illustrated in FIG. 10 can generate an output signal based on a state of a signal input thereto.

Embodiment 5

In this embodiment mode, a shift register circuit of one embodiment of the present invention will be described.

Figure 12:
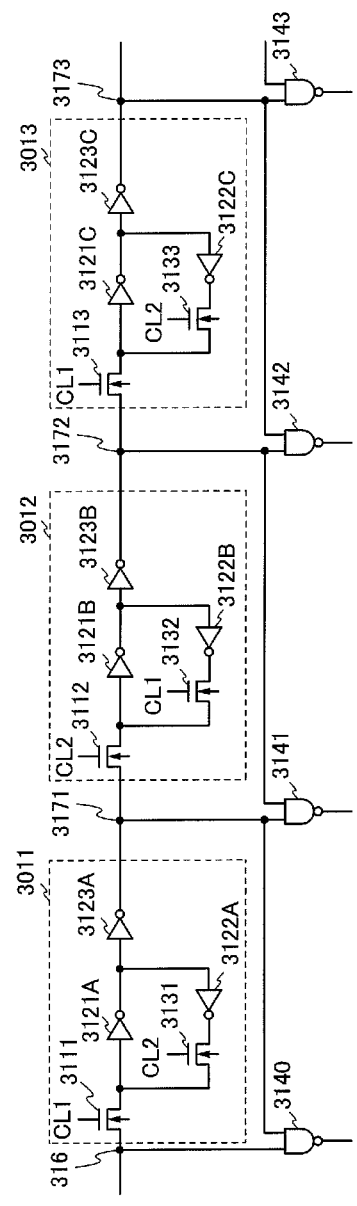
FIG. 12 is a circuit diagram illustrating an example of a circuit structure of a shift register according to Embodiment 4.

The shift register in this embodiment includes a plurality of logic circuits, and the plurality of sequential logic circuits are electrically connected in series. A specific structure will be described with reference to FIG. 12. FIG. 12 is a circuit diagram illustrating a structure of the shift register in this embodiment.

The shift register illustrated in FIG. 12 includes a logic circuit 3011, a logic circuit 3012, a logic circuit 3013, a NAND circuit 3140, a NAND circuit 3141, a NAND circuit 3142, and a NAND circuit 3143. Note that although FIG. 12 illustrates three (also referred to as three-stage) sequential logic circuits, one embodiment of the present invention is not limited thereto and may include at least two-stage sequential logic circuits.

In FIG. 12, a logic circuit included in the shift register includes, for example, the logic circuit including the transistor 611 and the transistor 613 which are described in Embodiment 4.

The logic circuit 3011 includes a transistor 3111, an inverter 3121A, an inverter 3122A, an inverter 3123A, and a transistor 3131. In the logic circuit 3011, a first clock signal is input to a gate of the transistor 3111, and a second clock signal is input to a gate of the transistor 3131.

The logic circuit 3012 includes a transistor 3112, an inverter 3121B, an inverter 3122B, an inverter 3123B, and a transistor 3132. In the logic circuit 3012, the second clock signal is input to a gate of the transistor 3112, and the first clock signal is input to a gate of the transistor 3132.

The logic circuit 3013 includes a transistor 3113, an inverter 3121C, an inverter 3122C, an inverter 3123C, and a transistor 3133. In the logic circuit 3013, the first clock signal is input to a gate of the transistor 3113, and the second clock signal is input to a gate of the transistor 3133.

An output terminal of the inverter 3123A in the logic circuit 3011 is electrically connected to one of a source and drain of the transistor 3112 in the logic circuit 3012. An output terminal of the inverter 3123B in the logic circuit 3012 is electrically connected to one of a source and drain of the transistor 3113 in the logic circuit 3013.

Further, in the logic circuit 3011, one of a source and drain of the transistor 3111 is electrically connected to a first input terminal of the NAND circuit 3140, and the output terminal of the inverter 3123A is electrically connected to a second input terminal of the NAND circuit 3140 and to a first input terminal of the NAND circuit 3141. In the logic circuit 3012, one of the source and drain of the transistor 3112 is electrically connected to the second input terminal of the NAND circuit 3140 and to the first input terminal of the NAND circuit 3141, and the output terminal of the inverter 3123B is electrically connected to the second input terminal of the NAND circuit 3141 and to a first input terminal of the NAND circuit 3142. In the logic circuit 3013, one of the source and drain of the transistor 3113 is electrically connected to the second input terminal of the NAND circuit 3141 and to the first input terminal of the NAND circuit 3142, and an output terminal of the inverter 3123C is electrically connected to a second input terminal of the NAND circuit 3142 and to a first input terminal of the NAND circuit 3143. Note that the connection point of the one of the source and drain of the transistor 3111 in the logic circuit 3011 and the first input terminal of the NAND circuit 3140 is also referred to as a node 316.

Figure 13:
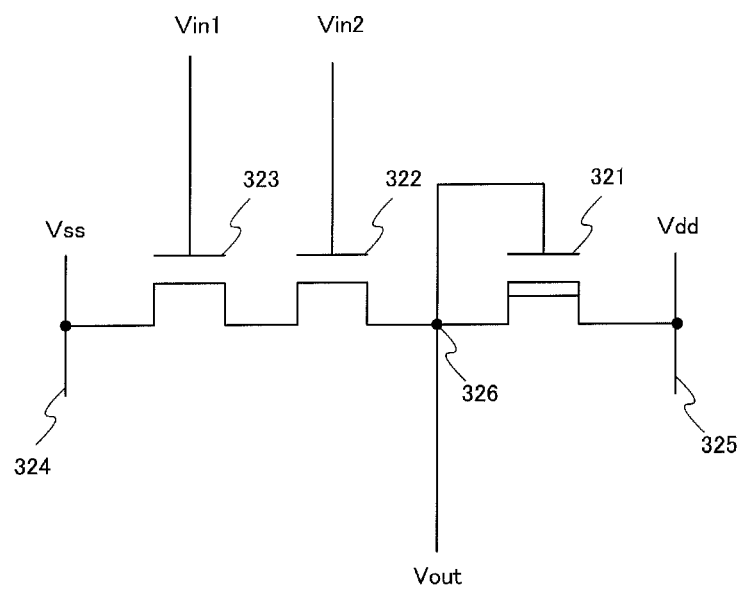
FIG. 13 is a circuit diagram illustrating a circuit structure of a NAND circuit according to Embodiment 4.

Each of the NAND circuits 3140 to 3143 can be formed using transistors having the same conductivity type as the transistors included in the logic circuits. By using transistors having the same conductivity type, the NAND circuits can be formed in the same process as the logic circuits, and thus can be easily formed. A circuit structure of the NAND circuit including transistors having the same conductivity type will be described with reference to FIG. 13. FIG. 13 is a circuit diagram illustrating a circuit structure of the NAND circuit in this embodiment.

The NAND circuit illustrated in FIG. 13 includes a transistor 321, a transistor 322, and a transistor 323.

The transistor 321 is a depletion type transistor. One of a source and drain of the transistor 321 is electrically connected to a power supply line 325 and supplied with a high power supply voltage. A gate and the other of the source and drain of the transistor 321 are electrically connected to each other.

The transistor 322 is an enhancement type transistor. One of a source and drain of the transistor 322 is electrically connected to the other of the source and drain of the transistor 321.

The transistor 323 is an enhancement type transistor. One of a source and drain of the transistor 323 is electrically connected to the other of the source and drain of the transistor 322. The other of the source and drain of the transistor 323 is electrically connected to a power supply line 324 and supplied with a low power supply voltage.

In the logic circuit in this embodiment, a first input signal is input to a gate of the transistor 323, a second input signal is input to a gate of the transistor 322, and a potential of a node 326 (also referred to as V326) between the transistor 321 and the transistor 322 is output as an output signal.

Next, operation of the NAND circuit illustrated in FIG. 13 will be described.

The operation of the NAND circuit in FIG. 13 can be classified into two categories depending on whether at least one of a voltage of the first input signal (also referred to as Vin1) and a voltage of the second input signal (Vin2) is low or the voltages of the first and second input signals are high. Each case will be described below. Note that in this embodiment, the case where data is 0 in a low state and data is 1 in a high state is described as an example; however, one embodiment of the present invention is not limited thereto, and data can be 1 in a low state and can be 0 in a high state.

In the case where Vin1=VH and Vin2=VL, the case where Vin1=VL and Vin2=VH, or the case where Vin1=VL and Vin2=VL, one or both of the transistors 322 and 323 are in an off state, and the resistance of the transistors 322 and 323 (the resistance is also referred to as R322+R323) is higher than the resistance of the transistor 321 (also referred to as R321), that is, R322+R323>R321; accordingly, V326 is VH, and a voltage of the output signal (also referred to as Vout) is VH.

Further, in the case where Vin1=VH and Vin2=VH, the transistors 321 and 322 are in an on state, and R322+R323<R321; accordingly, V326 is VL and Vout is VL. The above is the operation of the NAND circuit illustrated in FIG. 13.

As described above, when the NAND circuit is formed using transistors of the same conductivity type, it can be formed in the same process as another logic circuit. Moreover, the circuit structure of one embodiment of the present invention is not limited to the structure in FIG. 13, and another circuit structure can be employed if the same function can be provided.

Figure 14:
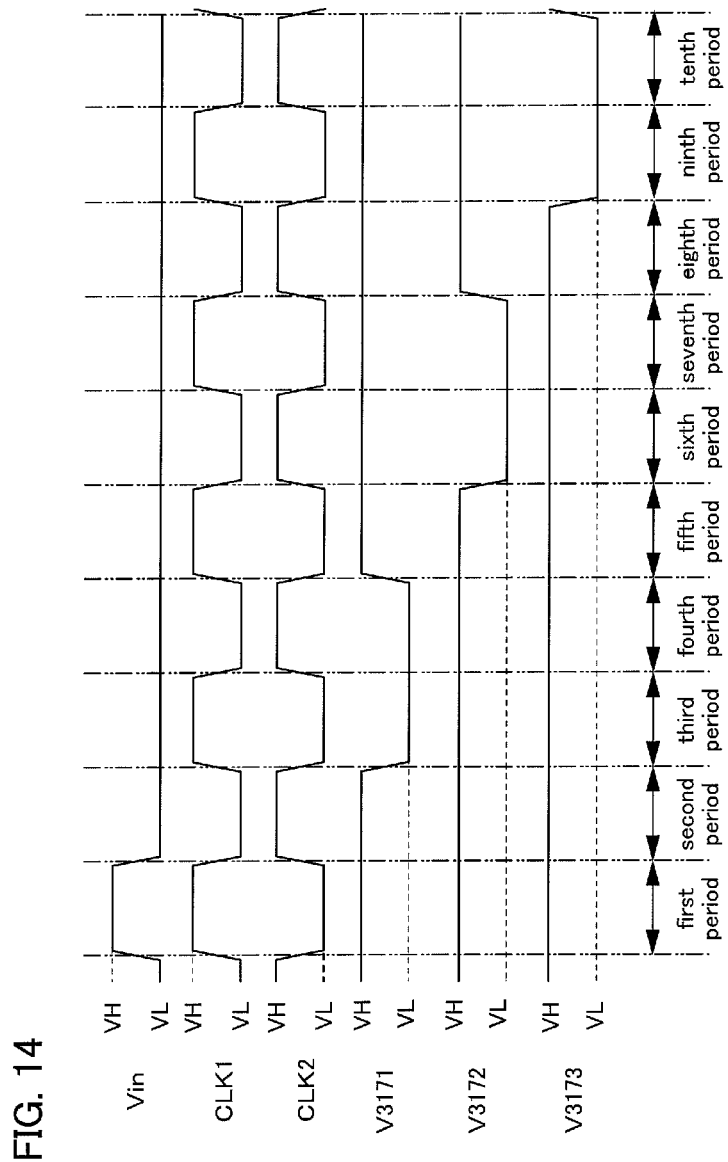
FIG. 14 is a timing diagram illustrating an example of operation of the shift register illustrated in FIG. 12.

Next, operation of the shift register illustrated in FIG. 12 will be described with reference to FIG. 14. FIG. 14 is a timing diagram illustrating the operation of the shift register in FIG. 12.

The operation of the shift register in this embodiment is classified into ten periods as illustrated in FIG. 14. In a first period, a potential Vin of an input signal to the logic circuit 3011 is VH. In a first period, a voltage Vin of an input signal to the logic circuit 3011 is VH. In a second period and a third period, a voltage of a node 3171 (also referred to as V3171) between the logic circuit 3011 and the logic circuit 3012 is changed from VH to VL. Further, in the third period and a fourth period, a voltage of an output signal from the NAND circuit 3140 is VH.

In the fourth period and a fifth period, a voltage of an input signal to the logic circuit 3012 (an output signal from the logic circuit 3011) is changed from VL to VH. In the fifth period and a sixth period, a voltage of a node 3172 (also referred to as V3172) between the logic circuit 3012 and the logic circuit 3013 is changed from VH to VL. In the sixth period and a seventh period, a voltage of an output signal from the NAND circuit 3141 is VH.

In the seventh period and an eighth period, a voltage of an input signal to the logic circuit 3013 (an output signal from the logic circuit 3012) is changed from VL to VH. In the eighth period and a ninth period, a voltage of a node 3173 (also referred to as V3173) between the logic circuit 3013 and a next-stage logic circuit is changed from VH to VL. In the ninth period and a tenth period, a voltage of an output signal from the NAND circuit 3142 is VH.

When another logic circuit is connected to an output terminal of the logic circuit 3013, a voltage of an input signal of the logic circuit is changed from VL to VH in a given period and a voltage of an output signal of the logic circuit is changed into VH in another given period as described above. Moreover, in a period where a voltage of the output signal from the logic circuit is VL, a voltage of an output signal from the NAND circuit 3143 is VH.

As described above, a shift register can be constituted by logic circuits including TFTs including an oxide semiconductor. The TFT including an oxide semiconductor has higher mobility than a conventional TFT including amorphous silicon; therefore, by applying the TFT including an oxide semiconductor to the shift register, the shift register can operate at high speed.

Note that this embodiment can be combined as appropriate with any of the other embodiments.

Embodiment 6

In this embodiment, an example of a structure of a display device which is one embodiment of the present invention will be described.

Figure 15:
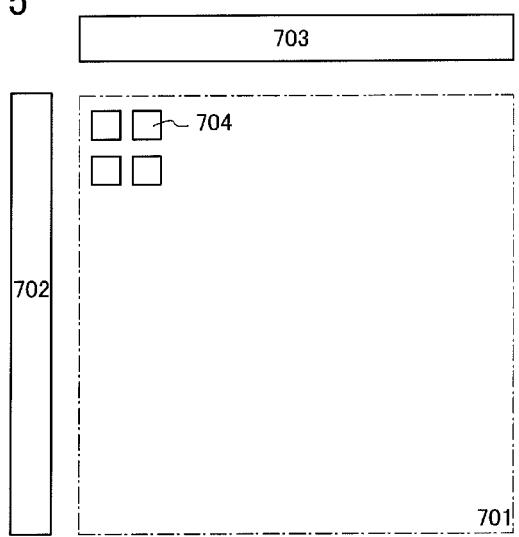
FIG. 15 is a block diagram illustrating a structure of a display device according to Embodiment 6.

The display device which is one embodiment of the present invention can be applied to a variety of display devices such as a liquid crystal display device and an electroluminescent display device. A structure of the display device of this embodiment will be described with reference to FIG. 15. FIG. 15 is a block diagram illustrating a structure of the display device of this embodiment.

As illustrated in FIG. 15, the display device of this embodiment includes a pixel portion 701, a scan line driver circuit 702, and a signal line driver circuit 703.

The pixel portion 701 includes a plurality of pixels 704 and has a dot matrix structure. Specifically, the plurality of pixels 704 are arranged in rows and columns. Each pixel 704 is electrically connected to the scan line driver circuit 702 through a scan line and electrically connected to the signal line driver circuit 703 through a signal line. Note that in FIG. 15, scan lines and signal lines are omitted for convenience. The scan line 105 illustrated in FIG. 1 and the signal line 103 illustrated in FIG. 1, for example, may be employed. Further, the scan line 107 illustrated in FIG. 1 can also be controlled by the scan line driver circuit which controls the scan line electrically connected to the pixels.

The scan line driver circuit 702 is a circuit for selecting the pixel 704 to which a data signal is input, and outputs a selection signal to the pixel 704 through the scan line.

The signal line driver circuit 703 is a circuit for outputting data written to the pixel 704 as a signal, and outputs pixel data as a signal through the signal line to the pixel 704 selected by the scan line driver circuit 702. In addition, the display device of this embodiment includes a transistor which, like the transistor 112 illustrated in FIG. 1, is electrically connected to the signal line and makes the signal line and the reference voltage line electrically connected during an on state.

The pixel 704 includes at least a display element and a switching element. A liquid crystal element or a light-emitting element such as an EL element can be applied to the display element, for example. A transistor can be applied to the switching element, for example.

Figure 16A:
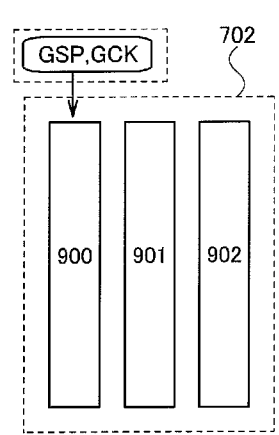
FIGS. 16A and 16B are block diagrams illustrating a structure of a driver circuit in a display device according to Embodiment 6.
Figure 16B:
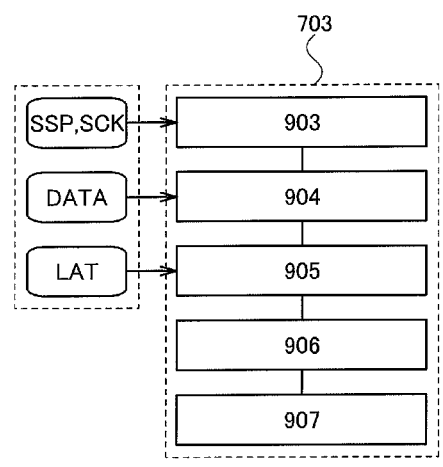

Next, an example of structures of the scan line driver circuit 702 and the signal line driver circuit 703 will be described with reference to FIGS. 16A and 16B. FIGS. 16A and 16B are block diagrams each illustrating a structure of the driver circuit. FIG. 16A is a block diagram illustrating a structure of the scan line driver circuit. FIG. 16B is a block diagram illustrating a structure of the signal line driver circuit.

As illustrated in FIG. 16A, the scan line driver circuit 702 includes a shift register 900, a level shifter 901, and a buffer 902.

Signals such as a gate start pulse (GSP) and a gate clock signal (GCK) are input to the shift register 900, and selection signals are sequentially output from sequential logic circuits. Moreover, the shift register shown in Embodiment 2 can be applied to the shift register 900.

Further, as illustrated in FIG. 16B, the signal line driver circuit 703 includes a shift register 903, a first latch circuit 904, a second latch circuit 905, a level shifter 906, and a buffer 907.

A signal such as a start pulse (SSP) is input to the shift register 903, and selection signals are sequentially output from the sequential logic circuits.

A data signal is input to the first latch circuit 904. The first latch circuit can include, for example, one or a plurality of logic circuits shown in the above embodiments.

The buffer 907 has a function of amplifying a signal and includes an operational amplifier or the like. The buffer 907 can include, for example, one or a plurality of logic circuits shown in the above embodiments.

The second latch circuit 905 can hold a latch (LAT) signal temporarily and outputs the held latch signals at one time to the pixel portion 701 in FIG. 15. This is referred to as line sequential driving. If the pixels perform dot sequential driving instead of the line sequential driving, the second latch circuit 905 is not required. The second latch circuit 905 can include, for example, one or a plurality of logic circuits shown in the above embodiments.

Next, operation of the display device illustrated in FIG. 15 will be described.

First, a scan line is selected by the scan line driver circuit 702. To the pixel 704 connected to the selected scan line, a data signal is output from the signal line driver circuit 703 through a signal line by a signal input from the scan line driver circuit 702. Accordingly, data is written to the pixel 704 connected to the selected scan line, and the pixel 704 is brought into a display state. In the case where a plurality of scan lines are provided, the scan lines are sequentially selected by the scan line driver circuit 702, and data is written to all the pixels 704. The above is the operation of the display device of this embodiment.

The circuits in the display device illustrated in FIG. 15 can all be provided over one substrate, or can be formed using transistors of the same conductivity type. By providing the circuits over one substrate, the size of the display device can be reduced. By using transistors of the same conductivity type, the process can be simplified.

Note that this embodiment can be combined as appropriate with any of the other embodiments.

Embodiment 7

In this embodiment, a liquid crystal display device will be described as an example of the display device shown in Embodiment 6.

Figure 17:
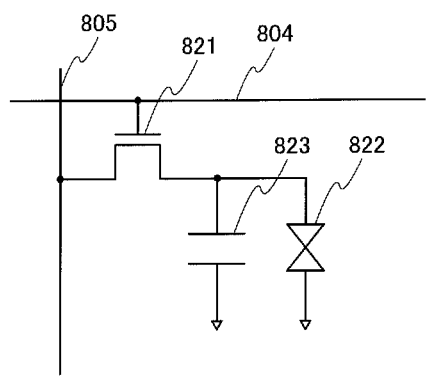
FIG. 17 is a circuit diagram illustrating a circuit structure of a pixel in a display device according to Embodiment 7.

An example of a circuit structure of a pixel in a display device in this embodiment will be described with reference to FIG. 17. FIG. 17 is a circuit diagram illustrating a circuit structure of a pixel in the display device in this embodiment.

As illustrated in FIG. 17, the pixel includes a transistor 821, a liquid crystal element 822, and a capacitor 823.

The transistor 821 serves as a selection switch. A gate of the transistor 821 is electrically connected to a scan line 804, and one of a source and drain thereof is electrically connected to a signal line 805.

The liquid crystal element 822 includes a first terminal and a second terminal. The first terminal of the liquid crystal element 822 is electrically connected to the other of the source and drain of the transistor 821. A ground potential or a potential with a given value is applied to the second terminal of the liquid crystal element 822. The liquid crystal element 822 includes a first electrode which serves as part of or the entire the first terminal, a second electrode which serves as part of or the entire second terminal, and a layer including liquid crystal molecules whose transmittance is changed by voltage application between the first electrode and the second electrode (such a layer is referred to as a liquid crystal layer).

The capacitor 823 includes a first terminal and a second terminal. The first terminal of the capacitor 823 is electrically connected to the other of the source and drain of the transistor 821. The ground potential or a potential with a given value is applied to the second terminal of the capacitor 823. The capacitor 823 includes a first electrode which serves as part of or the entire first terminal, a second electrode which serves as part of or the entire second terminal, and a dielectric layer. The capacitor 823 functions as a storage capacitor of the pixel. Note that although the capacitor 823 is not necessarily provided, the provision of the capacitor 823 can reduce adverse effects of leakage current of the transistor 821.

Note that for the display device in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be employed.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only within a narrow range of temperature, a liquid crystal composition containing a chiral agent at 5 wt % or more in order to improve the temperature range is used for the liquid crystal layer. The liquid crystal composition which includes liquid crystal exhibiting a blue phase and a chiral agent has a small response time of 10 μs to 100 μs, has optical isotropy, which makes the alignment process unnecessary, and has a small viewing angle dependence.

Next, operation of the pixel illustrated in FIG. 17 will be described.

First, a pixel to which data is written is selected, and the transistor 821 in the selected pixel is turned on by a signal input from the scan line 804.

At this time, a data signal from the signal line 805 is input through the transistor 821, so that the first terminal of the liquid crystal element 822 has the same voltage as the data signal, and the transmittance of the liquid crystal element 822 is set depending on voltage applied between the first terminal and the second terminal. After data writing, the transistor 821 is turned off by a signal input from the scan line 804, the transmittance of the liquid crystal element 822 is maintained during a display period, and the pixel is brought into a display state. The above operation is sequentially performed for the scan lines 804, and the above operation is performed in all the pixels. The above is the operation of the pixel.

In displaying moving images, a liquid crystal display device has a problem that a long response time of liquid crystal molecules causes afterimages or motion blur. In order to improve the moving-image characteristics of a liquid crystal display device, a driving method called black insertion is employed in which black is displayed on the whole screen every other frame period.

Further, a driving method called double-frame rate driving may be employed in which a vertical synchronizing frequency is set 1.5 times or more, preferably, 2 times or more as high as a usual vertical synchronizing frequency to improve the response speed.

Further, in order to improve the moving-image characteristics of a liquid crystal display device, a driving method may be employed in which a plurality of LED (light-emitting diodes) light sources or a plurality of EL light sources are used to form a surface light source as a backlight, and each light source of the surface light source is independently driven in a pulsed manner in one frame period. As the surface light source, three or more kinds of LEDs may be used or an LED emitting white light may be used. Since a plurality of LEDs can be controlled independently, the timing at which the LED emits light can be synchronized with the timing at which the liquid crystal layer is optically modulated. In this driving method, part of the LEDs can be turned off; therefore, an effect of reducing power consumption can be obtained particularly in the case of displaying an image having a large black part.

By combining these driving methods, the display characteristics of a liquid crystal display device, such as moving-image characteristics, can be improved as compared to those of conventional liquid crystal display devices.

Figure 18A:
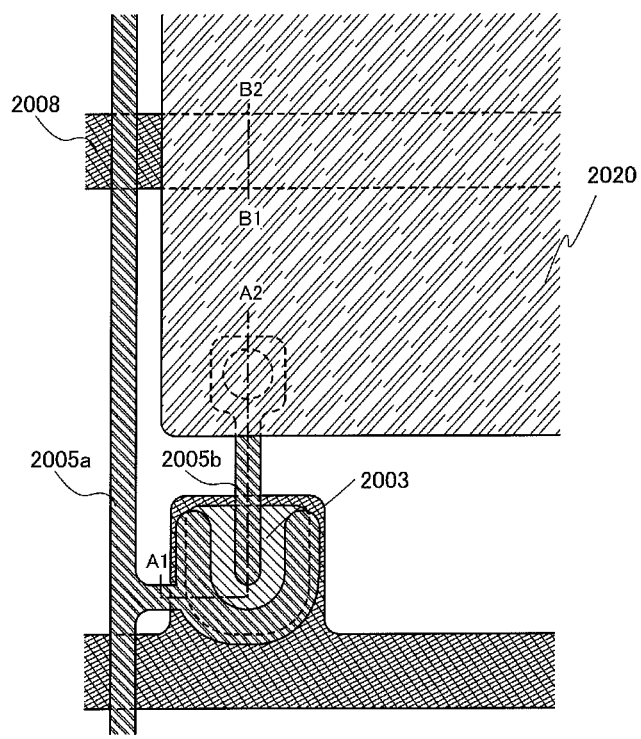
FIGS. 18A and 18B illustrate a structure of a pixel in a display device according to Embodiment 7.
Figure 18B:
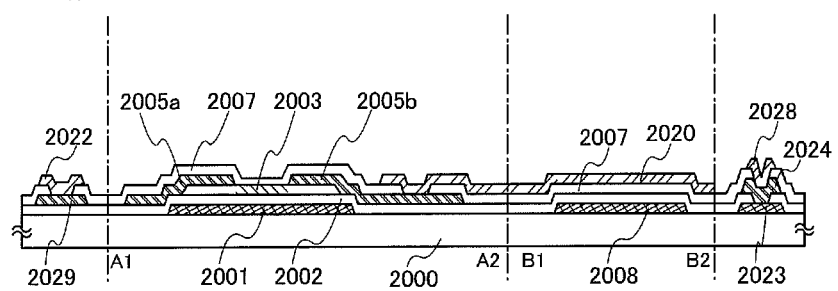

Next, a structure of a display device in this embodiment which includes the above pixel will be described with reference to FIGS. 18A and 18B. FIGS. 18A and 18B illustrate a structure of the pixel in the display device in this embodiment. FIG. 18A is a top view, and FIG. 18B is a cross-sectional view. Note that dotted lines A1-A2 and B1-B2 in FIG. 18A correspond to cross sections A1-A2 and B1-B2 in FIG. 18B, respectively.

As illustrated in FIGS. 18A and 18B, the display device in this embodiment includes, in the cross section of A1-A2, a gate electrode 2001 over a substrate 2000; an insulating film 2002 provided over the gate electrode 2001; an oxide semiconductor layer 2003 provided over the insulating film 2002; a pair of electrodes 2005*a* and 2005*b* provided over the oxide semiconductor layer 2003; an oxide insulating layer 2007 provided over the electrodes 2005*a* and 2005*b* and the oxide semiconductor layer 2003; and an electrode 2020 which is in contact with the electrode 2005*b* through an opening provided in the oxide insulating layer 2007.

Moreover, the display device includes, in the cross section of B1-B2, an electrode 2008 over the substrate 2000; the insulating film 2002 over the electrode 2008; the oxide insulating layer 2007 provided over the insulating film 2002; and the electrode 2020 provided over the oxide insulating layer 2007.

Electrodes 2022 and 2029 and electrodes 2023, 2024, and 2028 serve as a wiring or an electrode for connection with an FPC.

As the transistor in this embodiment, for example, the transistor 252 illustrated in FIGS. 2A and 2B can be used, and therefore a detailed description thereof is omitted here.

The electrodes 2020, 2022 and 2028 are formed using indium oxide ($In_2O_3$), an indium oxide-tin oxide alloy ($In_2O_3$—$SnO_2$, referred to as ITO), or the like by a sputtering method, a vacuum evaporation method, or the like. Such a material is etched with a hydrochloric acid-based solution. However, since a residue is easily generated particularly in etching of ITO, an indium oxide-zinc oxide alloy ($In_2O_3$—ZnO) may be used to improve etching processability.

FIGS. 19A1 and 19A2 are a cross-sectional view and a top view of a gate wiring terminal portion, respectively. FIG. 19A1 is a cross-sectional view taken along line C1-C2 in FIG. 19A2. In FIG. 19A1, a transparent conductive film 2055 formed over a protective insulating film 2054 is a terminal electrode for connection which serves as an input terminal. Further, in FIG. 19A1, in the terminal portion, a first terminal 2051 which is formed of the same material as a gate wiring and a connection electrode 2053 which is formed of the same material as a source wiring overlap with each other with a gate insulating layer 2052 therebetween and are electrically connected through the transparent conductive film 2055. Moreover, the connection electrode 2053 and the transparent conductive film 2055 are electrically connected through a contact hole provided in the protective insulating film 2054.

FIGS. 19B1 and 19B2 are a cross-sectional view and a top view of a source wiring terminal portion, respectively. FIG. 19B1 is a cross-sectional view taken along line D1-D2 in FIG. 19B2. In FIG. 19B1, the transparent conductive film 2055 formed over the protective insulating film 2054 is a terminal electrode for connection which serves as an input terminal. Further, in FIG. 19B1, in the terminal portion, an electrode 2056 which is formed of the same material as the gate wiring is placed below a second terminal 2050 which is electrically connected to the source wiring, so as to overlap with the second terminal 2050 with the gate insulating layer 2052 interposed therebetween. The electrode 2056 is not electrically connected to the second terminal 2050. When the electrode 2056 is set to have a potential different from that of the second terminal 2050, for example, a floating potential, GND, or 0 V, a capacitor for preventing noise or static electricity can be formed. Further, the second terminal 2050 is electrically connected to the transparent conductive film 2055 through a contact hole provided in the protective insulating film 2054.

A plurality of gate wirings, source wirings, and capacitor wirings are provided depending on the pixel density. Moreover, a plurality of first terminals at the same potential as the gate wiring, a plurality of second terminals at the same potential as the source wiring, a plurality of third terminals at the same potential as the capacitor wiring, and the like are arranged in the terminal portion. The number of each of the terminals can be a given number and is determined as appropriate by a practitioner.

Accordingly, a pixel TFT portion including a bottom-gate n-channel TFT, and a storage capacitor can be completed. Then, they are arranged in a matrix corresponding to respective pixels so that a pixel portion is formed; thus, one of substrates for manufacturing an active matrix display device can be formed. In this specification, such a substrate is referred to as an active matrix substrate for convenience.

In the case of manufacturing an active matrix liquid crystal display device, an active matrix substrate and a counter substrate provided with a counter electrode are fixed to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

The n-channel transistor obtained in this embodiment uses the In—Ga—Zn—O-based film as a channel formation layer and thus has favorable dynamic characteristics. Accordingly, these driving methods can be applied in combination with the n-channel transistor of this embodiment.

In the case of manufacturing a light-emitting display device, in order to set one electrode (also referred to as a cathode) of an organic light-emitting element to have a low power supply voltage, for example, GND or 0 V, a fourth terminal for making the cathode have the low power supply voltage such as GND or 0 V is provided in a terminal portion. Moreover, when the light-emitting display device is formed, a power supply line is provided in addition to a source wiring and a gate wiring. Accordingly, a fifth terminal electrically connected to the power supply line is provided in the terminal portion.

With the use of TFTs including an oxide semiconductor in a gate line driver circuit or a source line driver circuit, manufacturing cost is reduced. Moreover, by directly connecting a gate electrode of the TFT used in the driver circuit with a source wiring or a drain wiring, the number of contact holes can be reduced, so that a display device in which an area occupied by the driver circuit is reduced can be provided.

Therefore, according to this embodiment, a highly reliable display device with excellent electric characteristics can be provided at low cost.

Note that this embodiment can be combined as appropriate with any of the other embodiments.

Embodiment 8

In this embodiment, a light-emitting display device will be described as an example of the display device shown in Embodiment 6. As an example, a light-emitting display device in which electroluminescence is used for a light-emitting element will be described in this embodiment.

Light-emitting elements utilizing electroluminescence are classified according to whether the light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, so that light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light-emission that utilizes a donor level and an acceptor level. A thin-film inorganic EL element has a structure where a light-emitting layer is sandwiched between dielectric layers, which are further sandwiched between electrodes, and its light emission mechanism is localized type light-emission that utilizes inner-shell electron transition of metal ions. Note that here, an organic EL element will be described as a light-emitting element.

Figure 20:
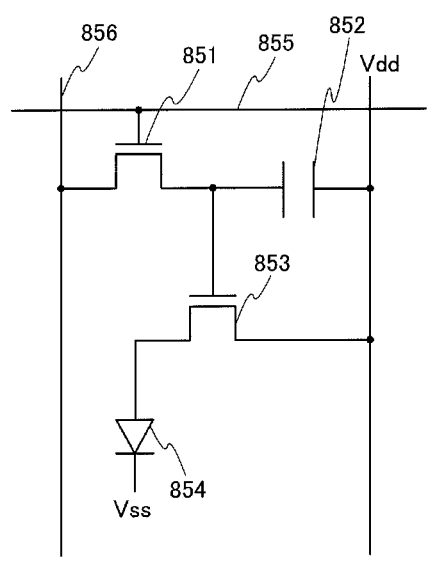
FIG. 20 is a circuit diagram illustrating a circuit structure of a pixel in a display device according to Embodiment 8.

A circuit structure of a pixel in a display device in this embodiment will be described with reference to FIG. 20. FIG. 20 is a circuit diagram illustrating a circuit structure of a pixel of the display device in this embodiment.

As illustrated in FIG. 20, the pixel of the display device in this embodiment includes a transistor 851, a capacitor 852 which serves as a storage capacitor of the pixel, a transistor 853, and a light-emitting element 854.

A gate of the transistor 851 is electrically connected to a scan line 855, and one of a source and drain of the transistor 851 is electrically connected to a signal line 856.

The capacitor 852 includes a first terminal and a second terminal. The first terminal of the capacitor 852 is electrically connected to the other of the source and drain of the transistor 851. A high power supply voltage is supplied to the second terminal of the capacitor 852.

A gate of the transistor 853 is electrically connected to the other of the source and drain of the transistor 851. The high power supply voltage is applied to one of a source and drain of the transistor 853.

The light-emitting element 854 includes a first terminal and a second terminal. The first terminal is electrically connected to the other of the source and drain of the transistor 853. A low power supply voltage is applied to the second terminal.

Next, operation of the pixel illustrated in FIG. 20 will be described.

First, a pixel to which data is written is selected. In the selected pixel, the transistor 851 is turned on by a scan signal input from the scan line 855, and a video signal (also referred to as a data signal), which has a fixed voltage, is input from the signal line 856 to the gate of the transistor 853.

The transistor 853 is turned on or off depending on a voltage in response to the data signal input to the gate. When the transistor 853 is on, a voltage applied between the first terminal and the second terminal of the light-emitting element 854 depends on a gate voltage of the transistor 853 and the high power supply voltage. At this time, current flows through the light-emitting element 854 depending on the voltage applied between the first terminal and the second terminal, and the light-emitting element 854 emits light with luminance corresponding to the amount of current flowing between the first terminal and the second terminal. Further, since the gate voltage of the transistor 853 is held for a certain period by the capacitor 852, the light-emitting element 854 maintains a light-emitting state for a certain period.

When the data signal input from the signal line 856 to the pixel is digital, the pixel enters a light-emitting state or a non-light-emitting state by switching on and off of the transistor. Accordingly, grayscale can be expressed by an area ratio grayscale method or a time ratio grayscale method. An area ratio grayscale method refers to a driving method in which one pixel is divided into a plurality of subpixels and each of the subpixels with the circuit structure illustrated in FIG. 20 is independently driven in accordance with a data signal so that grayscale is expressed. A time ratio grayscale method refers to a driving method in which a period during which a pixel is in a light-emitting state is controlled so that grayscale is expressed.

Since the response speed of light-emitting elements is higher than that of liquid crystal elements or the like, the light-emitting elements are suitable for a time ratio grayscale method as compared to the liquid crystal elements. Specifically, when a time ratio grayscale method is employed for display, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of a period in which pixels actually emit light in one frame period can be controlled with video signals, whereby and grayscale can be expressed.

Among driver circuits in the light-emitting display device, part of the driver circuits which can be formed using n-channel TFTs can be formed over a substrate where TFTs in a pixel portion are formed. Moreover, a signal line driver circuit and a scan line driver circuit can be formed using only n-channel TFTs.

Next, structures of a light-emitting element are described with reference to FIGS. 21A to 21C. A cross-sectional structure of a pixel is described here by taking an n-channel driver TFT as an example. TFTs 7001, 7011, and 7021, which are driving TFTs used in display devices in FIGS. 21A, 21B, and 21C respectively, can be formed in a manner similar to the manner of forming the enhancement-type TFTs shown in the above embodiments. The TFTs include an oxide semiconductor layer as a semiconductor layer, and have high reliability.

In order to extract light emitted from the light-emitting element, at least one of an anode and a cathode should be transparent. There are following structures of a light-emitting element which is formed over the same substrate as a TFT: a top-emission structure in which light is extracted through the surface opposite to the substrate, a bottom-emission structure in which tight is extracted through the surface of the substrate, and a dual-emission structure in which light is extracted through the surface opposite to the substrate and the surface of the substrate. The pixel structure of the present invention can be applied to a light-emitting element having any of these emission structures.

A light-emitting element having a top-emission structure will be described with reference to FIG. 21A.

Figure 21A:
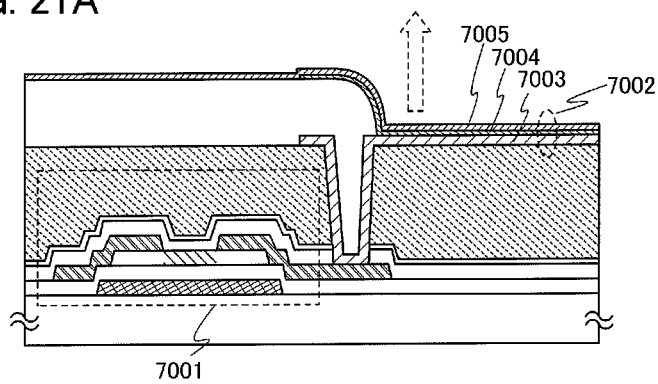
FIGS. 21A to 21C are cross-sectional views illustrating a structure of a pixel in a display device according to Embodiment 8.
Figure 21B:
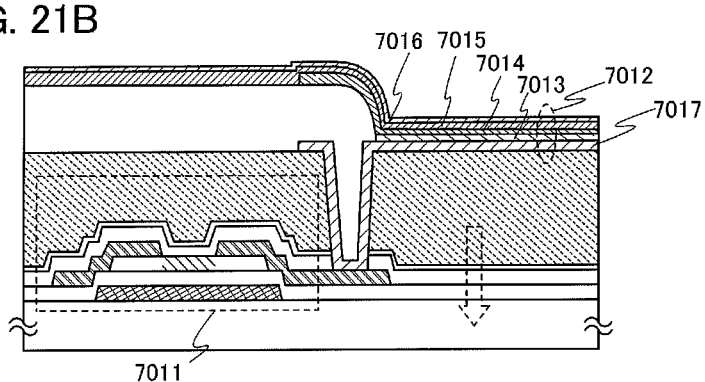
Figure 21C:
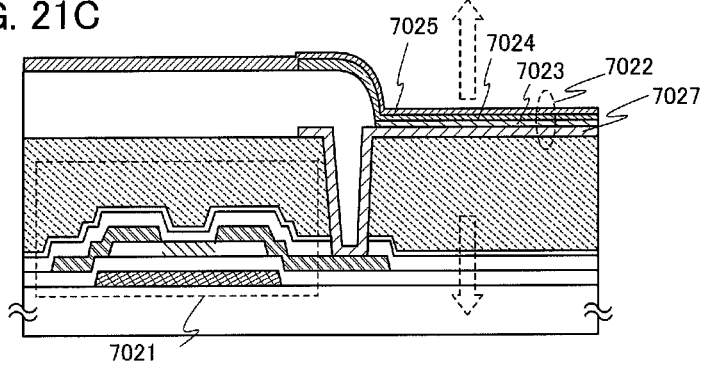

FIG. 21A is a cross-sectional view of a pixel in the case where the driver TFT 7001 is of an n-type and light is emitted from a light-emitting element 7002 through an anode 7005. In FIG. 21A, a cathode 7003 of the light-emitting element 7002 is electrically connected to the driver TFT 7001, and a light-emitting layer 7004 and the anode 7005 are stacked in this order over the cathode 7003. The cathode 7003 can be formed using any of materials which has a low work function and a conductive film of which reflects light. For example, Ca, Al, CaF, MgAg, or AlLi is preferably used. The light-emitting layer 7004 may be formed as a single layer or a stack of plural layers. When the light-emitting layer 7004 is formed as a stack of plural layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided as long as the light-emitting layer is provided. The anode 7005 is formed of a light-transmitting conductive material. For example, the anode 7005 may be formed using a light-transmitting conductive film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the pixel illustrated in FIG. 21A, light is emitted from the light-emitting element 7002 to the anode 7005 side as indicated by an arrow.

Next, a light-emitting element having a bottom-emission structure will be described with reference to FIG. 21B. FIG. 21B is a cross-sectional view of a pixel in the case where the driver TFT 7011 is of an n-type and light is emitted from a light-emitting element 7012 through a cathode 7013. In FIG. 21B, the cathode 7013 of the light-emitting element 7012 is formed over a light-transmitting conductive film 7017 which is electrically connected to the driver TFT 7011, and a light-emitting layer 7014 and an anode 7015 are stacked in this order over the cathode 7013. Note that a blocking film 7016 for reflecting or blocking light may be formed so as to cover the anode 7015 when the anode 7015 has a light-transmitting property. For the cathode 7013, any of conductive materials which has a low work function can be used as in the case of FIG. 21A. Note that the cathode 7013 is formed with a thickness with which the cathode 7013 transmits light (preferably, approximately 5 nm to 30 nm). For example, an aluminum film with a thickness of 20 nm can be used as the cathode 7013. Similarly to the case of FIG. 21A, the light-emitting layer 7014 may be formed using either a single layer or a stack of plural layers. The anode 7015 is not required to transmit light, but can be formed of a light-transmitting conductive material as in the case of FIG. 21A. As the blocking film 7016, a metal film which reflects light can be used for example; however, it is not limited to a metal film. For example, a resin to which a black pigment is added can also be used.

The light-emitting element 7012 corresponds to a region where the light-emitting layer 7014 is sandwiched between the cathode 7013 and the anode 7015. In the pixel illustrated in FIG. 21B, light is emitted from the light-emitting element 7012 to the cathode 7013 side as indicated by an arrow.

Next, a light-emitting element having a dual-emission structure will be described with reference to FIG. 21C. In FIG. 21C, the cathode 7023 of the light-emitting element 7022 is formed over a light-transmitting conductive film 7027 which is electrically connected to the driver TFT 7021, and a light-emitting layer 7024 and an anode 7025 are stacked in this order over the cathode 7023. For the cathode 7023, any of conductive materials which has a low work function can be used as in the case of FIG. 21A. Note that the cathode 7023 is formed with a thickness with which the cathode 7023 transmits light. For example, an aluminum film with a thickness of 20 nm can be used as the cathode 7023. Similarly to the case of FIG. 21A, the light-emitting layer 7024 may be formed using either a single layer or a stack of plural layers. The anode 7025 can be formed of a light-transmitting conductive material as in the case of FIG. 21A.

The light-emitting element 7022 corresponds to a region where the anode 7025, the light-emitting layer 7024 and the cathode 7023 overlap with each other. In the pixel illustrated in FIG. 21C, light is emitted from the light-emitting element 7022 to both the anode 7025 side and the cathode 7023 side as indicated by arrows.

Although an organic EL element is described here as a light-emitting element, an inorganic EL element can alternatively be provided as a light-emitting element.

Although the example in which a thin film transistor (also referred to as a driver TFT) which controls the driving of a light-emitting element is electrically connected to the light-emitting element has been described, a structure may be employed in which a TFT for current control is connected between the driver TFT and the light-emitting element.

Figures 22A, 22B:
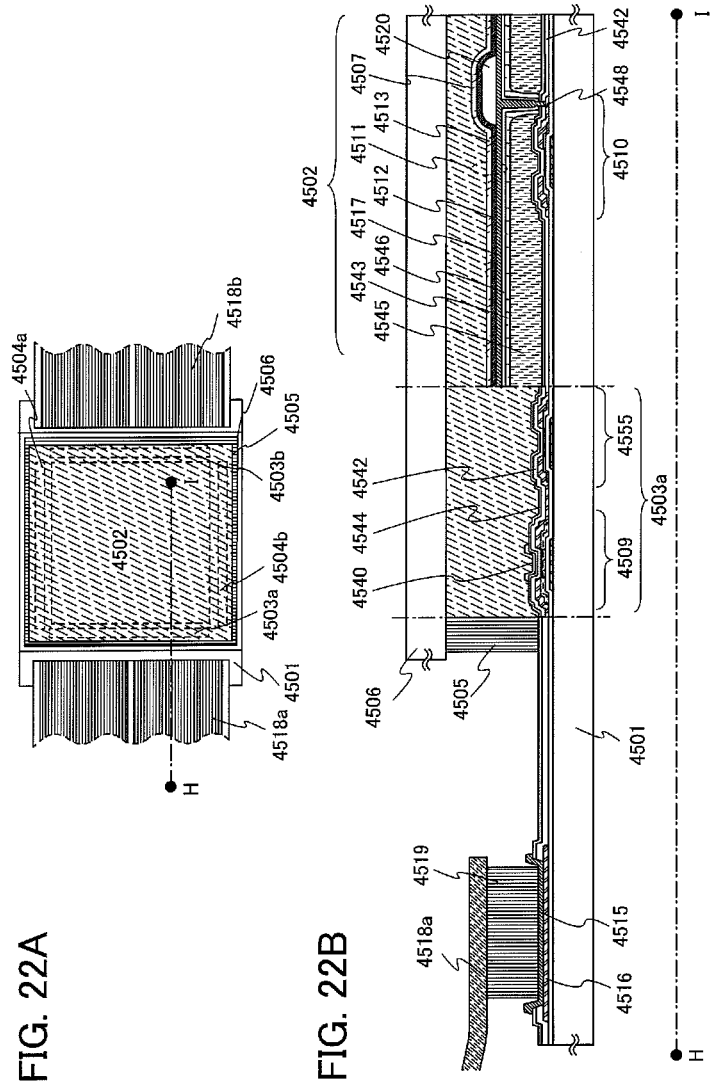
FIGS. 22A and 22B are a top view and a cross-sectional view illustrating a structure of a display device according to Embodiment 8.

Next, an appearance and a cross section of a display device (also referred to as a light-emitting panel) of this embodiment will be described with reference to FIGS. 22A and 22B. FIG. 22A is a plan view of a panel in which a TFT and a light-emitting element formed over a first substrate are sealed between the first substrate and a second substrate with a sealant. FIG. 22B is a cross-sectional view taken along line H-I in FIG. 22A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the pixel portion 4502, the signal line driver circuits 4503a and 4503b, the scan line driver circuits 4504a and 4504b, and the like are not exposed to air.

The pixel portion 4502, the signal line driver circuits 4503a and 4503b, and the scan line driver circuits 4504a and 4504b which are formed over the first substrate 4501 each include a plurality of TFTs. A TFT 4510 included in the pixel portion 4502 and a TFT 4509 and a TFT 4555 included in the signal line driver circuit 4503a are illustrated as an example in FIG. 22B.

As the TFTs 4509, 4510, and 4555, any of the highly reliable transistors including an oxide semiconductor layer as a semiconductor layer which are described in Embodiment 2 and Embodiment 3 can be employed. In this embodiment, the TFTs 4509, 4510, and 4555 are n-channel TFTs. In addition, an insulating layer 4542 is formed over the TFTs 4509, 4510, and 4555; an insulating layer 4544 is formed over the insulating layer 4542; and a conductive layer 4540 is provided over the TFT 4509 with the insulating layer 4542 and the insulating layer 4544 interposed therebetween. The conductive layer 4540 serves as a second gate electrode. In addition, an insulating layer 4545, an insulating layer 4543 and an insulating layer 4546 are formed over the insulating layer 4544.

The display device illustrated in FIGS. 22A and 22B includes a light-emitting element 4511. The light-emitting element 4511 has a stacked-layer structure including a first electrode 4517, an electroluminescent layer 4512, and a second electrode 4513, but the structure is not limited to the structure in this embodiment. The first electrode 4517 is electrically connected to a source electrode or drain electrode 4548 of the TFT 4510. Note that the structure of the light-emitting element 4511 can be changed as appropriate depending on a direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode 4517, and a sidewall of the opening is formed as an inclined surface with a continuous curvature.

The electroluminescent layer 4512 may be formed using either a single layer or a stack of plural layers.

Note that in order to prevent entry of oxygen, hydrogen, moisture, carbon dioxide, or the like into the light-emitting element 4511, a protective layer may be formed over the second electrode 4513 and the partition 4520. As the protective layer, a silicon nitride film, a silicon nitride oxide film, a DLC film, or the like can be formed.

In addition, a variety of signals and voltages are supplied from FPCs 4518a and 4518b to the signal line driver circuits 4503a and 4503b, the scan line driver circuits 4504a and 4504b, or the pixel portion 4502.

In this embodiment, a connection terminal electrode 4515 is formed using the same conductive film as the first electrode 4517 included in the light-emitting element 4511, and a terminal electrode 4516 is formed using the same conductive film as the source and drain electrodes included in the TFTs 4509, 4510, and 4555.

The connection terminal electrode 4515 is electrically connected to a terminal included in the FPC 4518a via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, poly(vinyl chloride) (PVC), acrylic, polyimide, an epoxy resin, a silicone resin, poly(vinyl butyral) (PVB), or ethylene with vinyl acetate (EVA) can be used. In this embodiment, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

As the signal line driver circuits 4503*a* and 4503*b* and the scan line driver circuits 4504*a* and 4504*b*, driver circuits formed by using a single crystal semiconductor film or a polycrystalline semiconductor film over a substrate separately prepared may be mounted. Alternatively, only the signal line driver circuits or a part thereof, or only the scan line driver circuits or a part thereof may be separately formed and then mounted. This embodiment is not limited to the structure illustrated in FIGS. 22A and 22B.

Through the above steps, a highly reliable light-emitting device (a display panel) can be manufactured.

Note that this embodiment can be combined as appropriate with any of the other embodiments.

Embodiment 9

In this embodiment, an electronic paper will be described as an example of the display device in Embodiment 6.

The logic circuit shown in the above embodiments can be used in an electronic paper. An electronic paper is also referred to as an electrophoretic display device (also referred to as an electrophoretic display) and has advantages of having high readability which is equivalent to normal paper and lower power consumption than other display devices, and being thin and lightweight.

There are a variety of modes of electrophoretic displays. The electrophoretic display includes a plurality of microcapsules dispersed in a solvent or a solute; each microcapsule containing first particles which are positively charged and second particles which are negatively charged. When electric field is applied to the microcapsules, the particles in the microcapsules move in opposite directions to each other and only the color of the particles gathered on one side is displayed. Note that the first particles or the second particles include a pigment, and do not move without an electric field. The first particles and the second particles have different colors (which may be colorless).

Thus, the electrophoretic display utilizes a so-called dielectrophoretic effect, in which a substance with high dielectric constant moves to a region with a high electric field. The electrophoretic display does not need to use a polarizing plate and a counter substrate, which are required in a liquid crystal display device, and therefore the thickness and weight of the electrophoretic display device can be reduced.

A solution in which the above microcapsules are dispersed in a solvent is referred to as electronic ink. Electronic ink can be printed on a surface of glass, plastic, fabric, paper, or the like. Furthermore, by use of a color filter or particles that have a pigment, color display can also be achieved.

In addition, if a plurality of above microcapsules are arranged as appropriate over an active matrix substrate so as to be interposed between two electrodes, an active matrix display device can be completed. Images can be displayed by application of an electric field to the microcapsules. For example, an active matrix substrate formed using the enhancement type TFT exemplified in the above embodiments can be used.

Note that the first particles and the second particles in the microcapsules may be formed from any one of a conductive material, an insulating material, a semiconductor material, a magnetic material, a liquid crystal material, a ferroelectric material, an electroluminescent material, an electrochromic material, and a magnetophoretic material, or formed from a composite material thereof.

Figure 23:
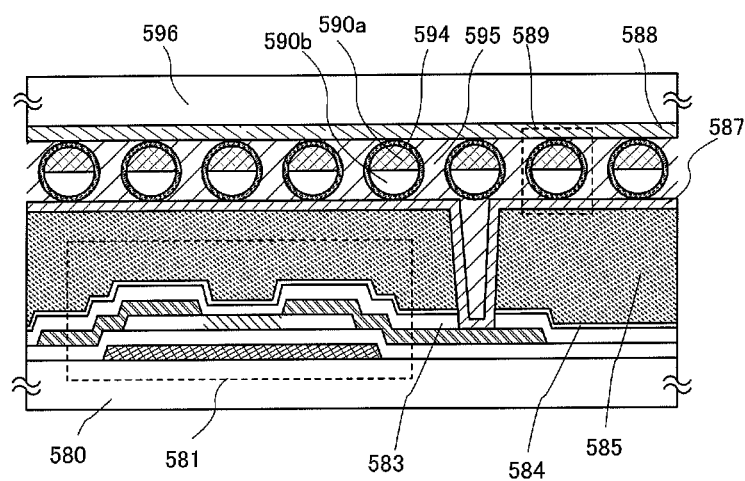
FIG. 23 is a cross-sectional view illustrating a structure of an electronic paper according to Embodiment 9.

Next, an example of a structure of an electronic paper in this embodiment will be described with reference to FIG. 23. FIG. 23 is a cross-sectional view illustrating a structure of an electronic paper in this embodiment.

The electronic paper illustrated in FIG. 23 includes a TFT 581 over a substrate 580; insulating layers 583, 584, and 585 which are stacked over the TFT 581; an electrode 587 which is in contact with a source electrode or a drain electrode of the TFT 581 through an opening provided in the insulating layers 583 to 585; and an electrode 588 provided on a substrate 596. In addition, the electronic paper includes, between the electrode 587 and the electrode 588 on the substrate 596, spherical particles 589 each of which includes a black region 590*a*, a white region 590*b*, and a cavity 594 filled with a liquid which surrounds the black region 590*a* and the white region 590*b*; and a filler 595 provided around the spherical particles 589.

The TFT 581 is a highly reliable TFT including an oxide semiconductor layer as a semiconductor layer. For example, the TFT 581 can be manufactured in a manner similar to the transistors in the above embodiments.

A method in which the spherical particles 589 are used is called a twisting ball display method. In the twisting ball display method, spherical particles each colored in black and white are arranged between a first electrode and a second electrode for a display element, and a potential difference is generated between the first electrode and the second electrode to control orientation of the spherical particles, so that display is performed.

Further, instead of the spherical element, an electrophoretic element can also be used. A microcapsule having a diameter of about 10 μm to 200 μm in which transparent liquid, positively charged white microparticles, and negatively charged black microparticles are encapsulated, is used. In the microcapsules which are provided between the first electrode and the second electrode, when an electric field is applied by the first electrode and the second electrode, the white microparticles and the black microparticles move to opposite sides from each other, so that white or black can be displayed. A display element using this principle is an electrophoretic display element. The electrophoretic display element has higher reflectance than a liquid crystal display element, and thus, an auxiliary light is unnecessary, power consumption is low, and a display portion can be recognized in a dim environment. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

The driver circuit described in Embodiment 2 or Embodiment 3 can be used as a driver circuit in the electronic paper in this embodiment, for example. Further, since a transistor including an oxide semiconductor layer can also be used as a transistor in the display portion, the driver circuit and the display portion can be provided over one substrate, for example.

Figure 24:
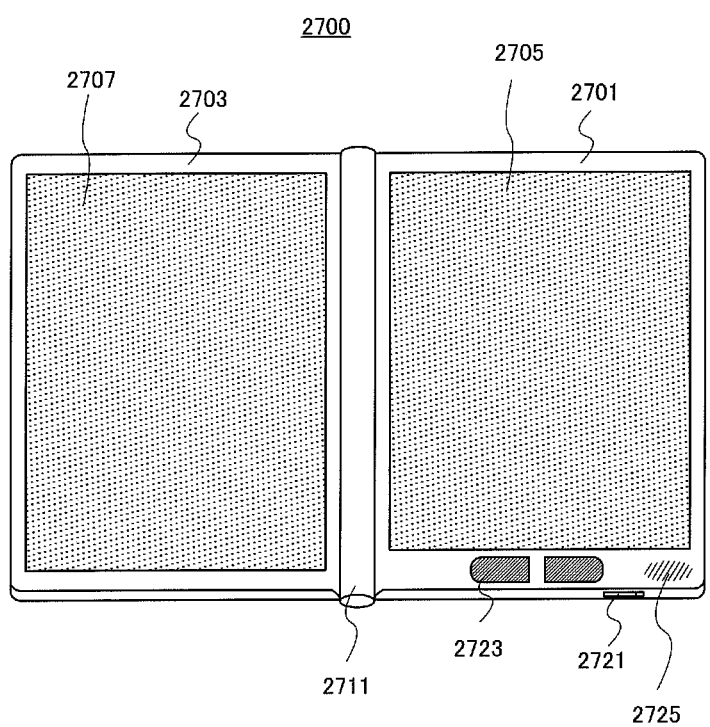
FIG. 24 illustrates an electronic device to which an electronic paper according to Embodiment 9 is applied.

The electronic paper can be used for any electronic devices for displaying information in all fields. For example, the electronic paper can be applied to an electronic book reader (an e-book reader), a poster, an advertisement in a vehicle such as a train, or a display on a variety of cards such as a credit card. FIG. 24 illustrates an example of the electronic devices. FIG. 24 illustrates an example of an electronic book reader.

As illustrated in FIG. 24, the electronic book reader 2700 includes two housings, a housing 2701 and a housing 2703. The housing 2701 and the housing 2703 are combined with a hinge 2711 so that the electronic book reader 2700 can be opened and closed along the hinge 2711. With such a structure, the electronic book reader 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 24) can display text and a display portion on the left (the display portion 2707 in FIG. 24) can display an image.

FIG. 24 illustrates an example in which the housing 2701 is provided with an operation portion and the like. For example, the housing 2701 is provided with a power supply switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter or a USB cable), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

Embodiment 10

In this embodiment, a system-on-panel display device will be described as one embodiment of the display device in Embodiment 6.

The logic circuit which is one embodiment of the present invention disclosed in this specification can be applied to a system-on-panel display device in which a display portion and a driver circuit are provided over one substrate. A specific structure of the display device will be described below.

The display device includes a display element in this embodiment. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device in this embodiment includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device or a light source (including a lighting device). Further, the display device also includes a module provided with a connector in its category. For example, the display device includes a module to which a flexible printed circuit (FPC), a tape automated bonding (TAB) tape, or a tape carrier package (TCP) is attached; a module having a TAB tape or a TCP at the end of which is provided with a printed wiring board; and a module having an integrated circuit (IC) which is directly mounted on a display element by a chip on glass (COG) method.

Next, the appearance and cross section of a liquid crystal display panel which is one embodiment of the display device in this embodiment will be described with reference to FIGS. 25A1 to 25B.

Each of FIGS. 25A1 and 25A2 is a top view of the display device in this embodiment, in which a liquid crystal element 4013 and TFTs 4010, 4011, and 4113 over a first substrate 4001 are sealed between the first substrate 4001 and a second substrate 4006 with a sealant 4005. The TFTs 4010, 4011, and 4113 include the In—Ga—Zn—O-based film shown in Embodiment 4 as a semiconductor layer. FIG. 25B is a cross-sectional view taken along line M-N in FIGS. 25A1 and 25A2.

In the display device in this embodiment, the sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 25A1 illustrates an example in which the signal line driver circuit 4003 is mounted by a COG method. FIG. 25A2 illustrates an example in which the signal line driver circuit 4003 is mounted by a TAB method.

The pixel portion 4002 and the scan line driver circuit 4004 provided over the first substrate 4001 include a plurality of TFTs. FIG. 25B illustrates the TFT 4010 included in the pixel portion 4002 and the TFTs 4011 and 4113 included in the scan line driver circuit 4004, as an example. Insulating layers 4020, 4021, and 4042 are provided over the TFTs 4010, 4011, and 4113. Further, a conductive layer 4040 is provided over the TFT 4011 with the insulating layers 4020 and 4042 interposed therebetween. The conductive layer 4040 serves as a second gate electrode.

As the TFTs 4010, 4011, and 4113, any of the TFT including an oxide semiconductor layer as a semiconductor layer which are described in the above embodiments can be employed. In this embodiment, the TFTs 4010, 4011, and 4113 are n-channel TFTs.

A pixel electrode 4030 included in the liquid crystal element 4013 is electrically connected to the TFT 4010. A counter electrode 4031 of the liquid crystal element 4013 is formed on the second substrate 4006. A portion where the pixel electrode 4030, the counter electrode 4031, and the liquid crystal layer 4008 overlap with one another corresponds to the liquid crystal element 4013. Note that the pixel electrode 4030 and the counter electrode 4031 are provided with an insulating layer 4032 and an insulating layer 4033 functioning as alignment films, respectively, and the liquid crystal layer 4008 is sandwiched between the pixel electrode 4030 and the counter electrode 4031 with the insulating layers 4032 and 4033 therebetween.

To the first substrate 4001 and the second substrate 4006, a material and a manufacturing method which can be used for the substrate 201 in the above embodiments can be applied.

A spacer 4035 is a columnar partition which is obtained by selective etching of an insulating film and is provided in order to control the distance (a cell gap) between the pixel electrode 4030 and the counter electrode 4031. Alternatively, a spherical spacer may be used. The counter electrode 4031 is electrically connected to a common potential line formed over the substrate where the TFT 4010 is formed. The counter electrode 4031 and the common potential line can be electrically connected to each other via conductive particles arranged between a pair of substrates using the common connection portion. Note that the conductive particles are included in the sealant 4005.

Note that although this embodiment shows an example of a transmissive liquid crystal display device, the present invention can also be applied to a reflective liquid crystal display device or a transflective liquid crystal display device.

Although, a polarizing plate is provided on the outer surface of the substrate (on the viewer side) and a coloring layer and an electrode used for a display element are sequentially provided on the inner surface of the substrate in the example of the liquid crystal display device in this embodiment, the polarizing plate may be provided on the inner surface of the substrate. The stacked-layer structure of the polarizing plate and the coloring layer is not limited to the structure in this embodiment and may be set as appropriate depending on materials of the polarizing plate and the coloring layer or conditions of the manufacturing process. Further, a light-blocking film serving as a black matrix may be provided.

In this embodiment, in order to reduce surface unevenness caused by the TFTs and to improve the reliability of the TFTs, the TFTs are covered with the insulating layers (the insulating layers 4020, 4021, and 4042) serving as a protective layer or a planarization insulating film. Note that the protective layer prevents penetration of contaminating impurities such as an organic matter, metal, or moisture included in air, and thus a dense film is preferable as the protective layer. The protective layer may be formed by a sputtering method with a single layer or a stack of any of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective layer is formed by a sputtering method in this embodiment, the method is not particularly limited and may be selected from a variety of methods. Further, when a non-reducible film is used, the protective layer can also serve as a reduction prevention layer.

Here, an insulating layer having a stacked-layer structure is formed as the protective layer and a silicon oxide film is formed as the insulating layer 4042, which is a first layer of the protective layer, by a sputtering method. The use of the silicon oxide film as the protective layer is effective in preventing hillocks of an aluminum film used as a source electrode and a drain electrode.

As a second layer of the protective layer, a silicon nitride film is formed by a sputtering method to provide the insulating layer 4020. The use of the silicon nitride film as the protective layer can prevent mobile ions such as sodium from entering the semiconductor region and changing electric characteristics of the TFT.

After the formation of the protective layer, the semiconductor layer may be subjected to heat treatment.

The insulating layer 4021 is formed as the planarizing insulating film. The insulating layer 4021 can be formed using a heat-resistant organic material such as polyimide, acrylic, polyimide amide, benzocyclobutene, polyamide, or epoxy can be used. As an alternative to such organic materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of any of these materials.

There is no particular limitation on the method of forming the insulating layer 4021. Depending on the material, the insulating layer 4021 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. When the insulating layer 4021 is formed using material solution, the semiconductor layer may be annealed at the same time of a baking step. When the baking step of the insulating layer 4021 and the annealing of the semiconductor layer are combined, a display device can be manufactured efficiently.

For the pixel electrode 4030 and the counter electrode 4031, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added, can be used.

Alternatively, a conductive composition including a conductive high molecule (also referred to as a conductive polymer) can be used for the pixel electrode 4030 and the counter electrode 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. For example, polyaniline or a derivative thereof, polypyrrole or a derivative thereof, polythiophene or a derivative thereof, or a copolymer of two or more of these materials can be given.

Further, a variety of signals and potentials are supplied to the signal line driver circuit 4003 which is separately formed, the scan line driver circuit 4004, or the pixel portion 4002 from an FPC 4018.

In this embodiment, a connection terminal electrode 4015 is formed using the same conductive film as the pixel electrode 4030 included in the liquid crystal element 4013, and a terminal electrode 4016 is formed using the same conductive film as source and drain electrode layers of the TFTs 4011 and 4010.

The connection terminal electrode 4015 is electrically connected to a terminal included in the FPC 4018 via an anisotropic conductive film 4019.

Note that FIGS. 25A1, 25A2, and 25B illustrate the example in which the signal line driver circuit 4003 is formed separately and mounted on the first substrate 4001; however, this embodiment is not limited to this structure. The scan line driver circuit may be separately formed and then mounted, or only a part of the signal line driver circuits or a part of the scan line driver circuits may be separately formed and then mounted.

As described above, a system-on-panel display device can be formed. For the display device in this embodiment, the logic circuit in the above embodiments can be used in the driver circuit, for example, and the logic circuit can be formed in the same process as the TFT in the display portion.

Note that this embodiment can be combined as appropriate with any of the structures described in other embodiments.

Embodiment 11

The semiconductor device in Embodiment 6 to Embodiment 10 can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio playback device, a large-sized game machine such as a pinball machine, and the like.

Figure 26A:
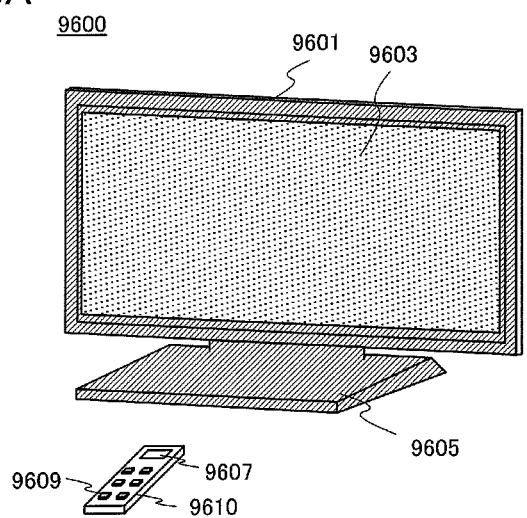
FIGS. 26A and 26B each illustrate an electronic device according to Embodiment 11.

FIG. 26A illustrates an example of a television device. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 26B:
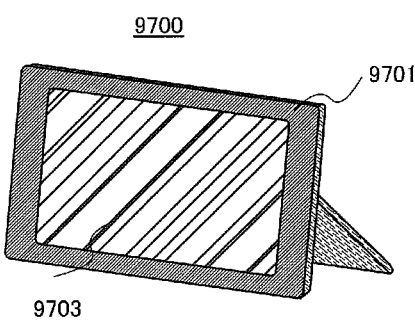

FIG. 26B illustrates an example of a digital photo frame 9700. For example, in the digital photo frame 9700, a display portion 9703 is incorporated in a housing 9701. The display portion 9703 can display a variety of images. For example, the display portion 9703 can display image data taken with a digital camera or the like and function as a normal photo frame.

Note that the digital photo frame 9700 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 27A:
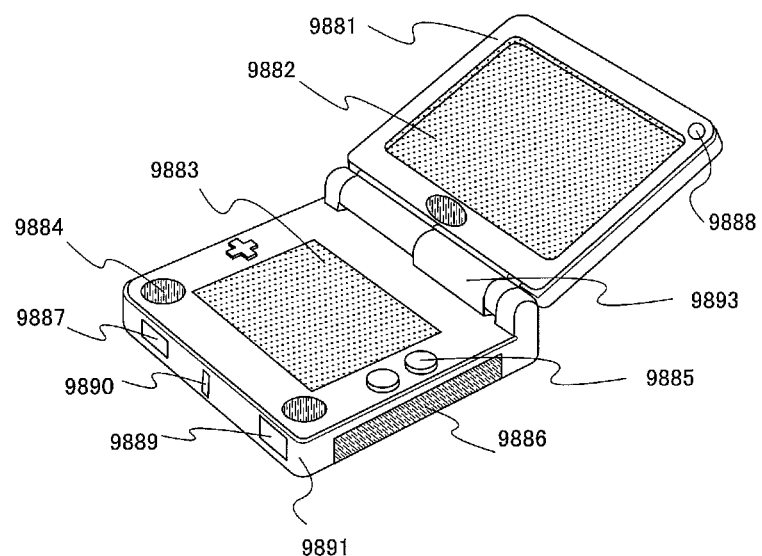
FIGS. 27A and 27B each illustrate an electronic device according to Embodiment 11.

FIG. 27A illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 27A is provided with a speaker portion 9884, a storage medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and another structure which is provided with at least a display device can be employed. The portable game console may include an additional accessory as appropriate. The portable game console illustrated in FIG. 27A has a function of reading a program or data stored in a storage medium to display it on the display portion, and a function of sharing data with another portable game console via wireless communication. Note that a function of the portable game console illustrated in FIG. 27A is not limited to those described above, and the portable game console can have a variety of functions.

Figure 27B:
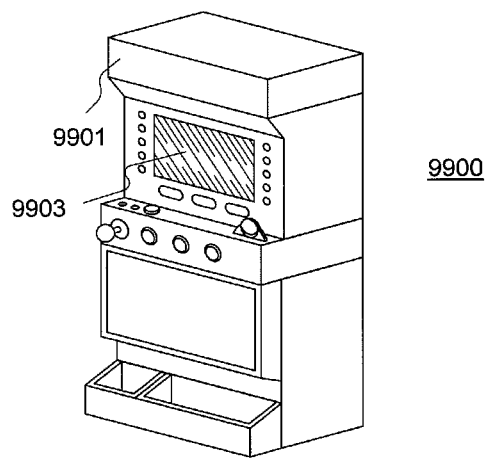

FIG. 27B illustrates an example of a slot machine which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and another structure which is provided with at least the display device according to the present invention may be employed. The slot machine 9900 may include an additional accessory as appropriate.

Figure 28A:
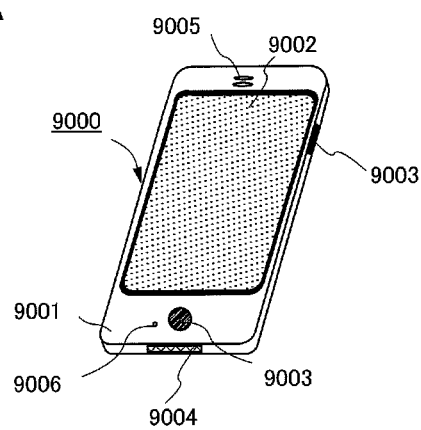
FIGS. 28A and 28B each illustrate an electronic device according to Embodiment 11.

FIG. 28A illustrates an example of a cellular phone. The cellular phone 9000 includes a housing 9001 in which a display portion 9002 is incorporated, an operation button 9003, an external connection port 9004, a speaker 9005, a microphone 9006, and the like.

Information can be input to the cellular phone 9000 illustrated in FIG. 28A by touching the display portion 9002 with a finger or the like. Moreover, users can make a call or write an e-mail by touching the display portion 9002 with their fingers or the like.

There are mainly three screen modes of the display portion 9002. The first mode is a display mode mainly for displaying images. The second mode is an input mode mainly for inputting information such as text. The third mode is a display-and-input mode in which two modes of the display mode and the input mode are combined.

For example, in the case of making a call or writing an e-mail, the display portion 9002 may be placed into a text input mode mainly for inputting text, and characters displayed on a screen can be input. In this case, it is preferable to display a keyboard or number buttons on almost the entire area of the screen of the display portion 9002.

When a detection device including a sensor for detecting inclination, such as a gyroscope or an acceleration sensor, is provided inside the cellular phone 9000, display on the screen of the display portion 9002 can be automatically switched by detecting the direction of the cellular phone 9000 (whether the cellular phone 9000 is placed horizontally or vertically for a landscape mode or a portrait mode).

Further, the screen modes are switched by touching the display portion 9002 or operating the operation button 9003 of the housing 9001. Alternatively, the screen modes can be switched depending on the kinds of image displayed on the display portion 9002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 9002 and if input by touching the display portion 9002 is not performed for a certain period, the screen mode may be controlled so as to be switched from the input mode to the display mode.

The display portion 9002 can also function as an image sensor. For example, an image of a palm print, a fingerprint, or the like is taken by touching the display portion 9002 with the palm or the finger, whereby personal authentication can be performed. Moreover, when a backlight or sensing light source which emits near-infrared light is provided in the display portion, an image of finger veins, palm veins, or the like can be taken.

Figure 28B:
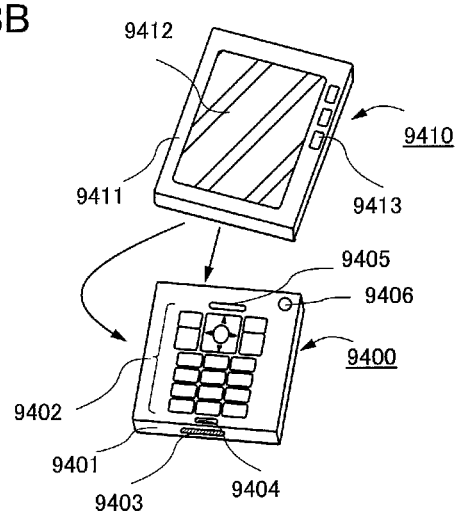

FIG. 28B illustrates another example of a cellular phone. The cellular phone in FIG. 28B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 which has a display function can be detachably attached to the communication device 9400 which has a phone function in two directions represented by the arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that this embodiment can be implemented in appropriate combination with any of the structures described in the other embodiments.

Embodiment 12

In this embodiment, a logic circuit including a transistor having a structure different from that in the above embodiment will be described.

Figures 29A, 29B:
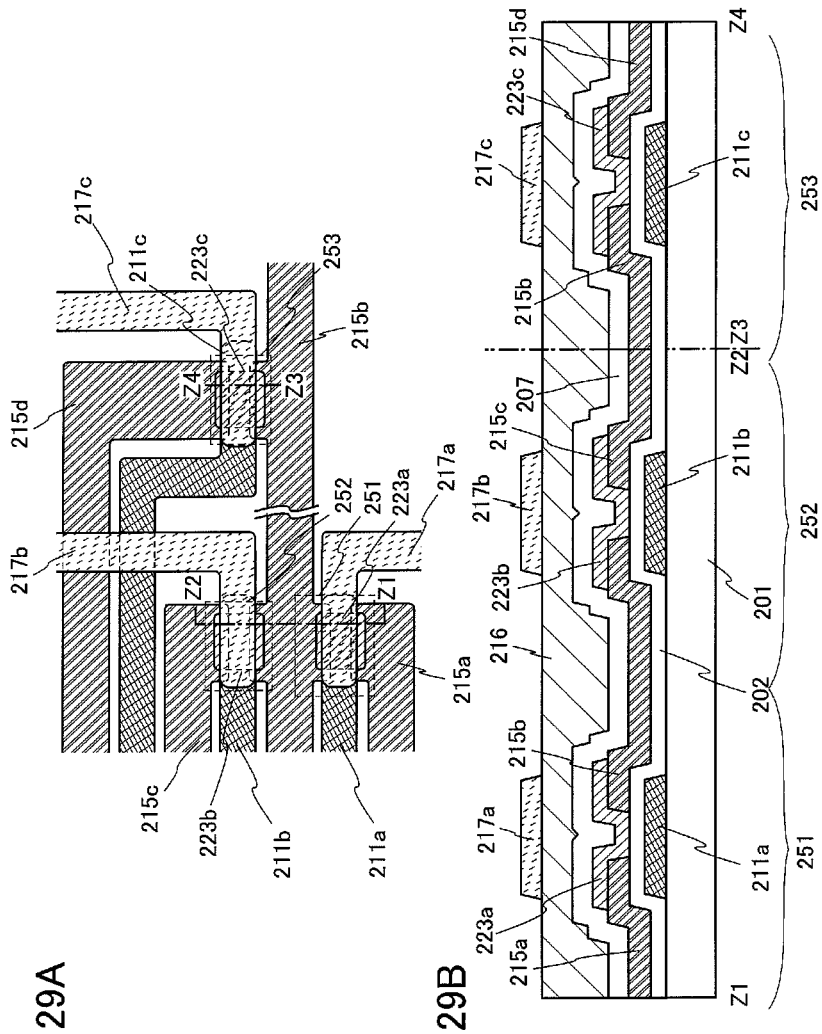
FIGS. 29A and 29B illustrate an example of a structure of a display device according to Embodiment 12.

Transistors in a display device which is one embodiment of the present invention are not limited to the transistors having the structure illustrated in FIGS. 2A and 2B and transistors having another structure may be used. A logic circuit to which a transistor having another structure is applied will be described with reference to FIGS. 29A and 29B. FIGS. 29A and 29B illustrate a structure of a driver circuit portion in this embodiment. FIG. 29A is a top view and FIG. 29B is a cross-sectional view taken along line Z1-Z2 and line Z3-Z4 of the driver circuit portion illustrated in FIG. 29A. Note that in the logic circuit illustrated in FIGS. 29A and 29B, the description of the logic circuit illustrated in FIGS. 2A and 2B can be employed for the description of the same components as the display device illustrated in FIGS. 2A and 2B.

The logic circuit illustrated in FIGS. 29A and 29B includes the transistor 251, the transistor 252, and the transistor 253, like the logic circuit illustrated in FIGS. 2A and 2B.

Further, structures of the transistors will be described. The transistor 251 includes the gate electrode 211*a* over the substrate 201, the gate insulating layer 202 over the gate electrode 211*a*, the conductive layer 215*a* and the conductive layer 215*b* over the gate insulating layer 202, and the oxide semiconductor layer 223*a* over the gate electrode 211*a* with the gate insulating layer 202 interposed therebetween and over the conductive layer 215*a* and the conductive layer 215*b*.

The transistor 252 includes the gate electrode 211*b* over the substrate 201, the gate insulating layer 202 over the gate electrode 211*b*, the conductive layer 215*b* and the conductive layer 215*c* over the gate insulating layer 202, and the oxide semiconductor layer 223*b* over the gate electrode 211*b* with the gate insulating layer 202 interposed therebetween and over the conductive layer 215*b* and the conductive layer 215*c*.

The transistor 253 includes the gate electrode 211*c* over the substrate 201, the gate insulating layer 202 over the gate electrode 211*c*, the conductive layer 215*b* and the conductive layer 215*d* over the gate insulating layer 202, and the oxide semiconductor layer 223*c* over the gate electrode 211*c* with the gate insulating layer 202 interposed therebetween and over the conductive layer 215*b* and the conductive layer 215*d*.

Each of the conductive layers 215*a* to 215*d* serves as a source electrode or a drain electrode.

The oxide semiconductor layers 223*a* to 223*c* are subjected to dehydration or dehydrogenation and the oxide insulating layer 207 is formed in contact with the oxide semiconductor layers 223*a* to 223*c*. A transistor including such an oxide semiconductor layer, which undergoes dehydration or dehydrogenation and then brought into contact with the oxide insulating layer 207 formed thereon, as a channel formation layer has high reliability because a V-th shift due to a long-term use or high load hardly occurs.

Further, in the driver circuit portion illustrated in FIGS. 29A and 29B, a planarizing insulating layer 216 is provided over the oxide insulating layer 207. In addition, a conductive layer 217*a* is provided over the oxide semiconductor layer 223*a* with the oxide insulating layer 207 and the planarizing insulating layer 216 interposed therebetween, a conductive layer 217*b* is provided over the oxide semiconductor layer 223*b* with the oxide insulating layer 207 and the planarizing insulating layer 216 interposed therebetween, and a conductive layer 217*c* is provided over the oxide semiconductor layer 223*c* with the oxide insulating layer 207 and the planarizing insulating layer 216 interposed therebetween. Each of the conductive layers 217*a* to 217*c* serves as a second gate electrode. The second gate voltage is applied to the conductive layers 217*a* to 217*c*, whereby the threshold voltage of the transistors 251 to 253 can be controlled.

The transistors 251 to 253 illustrated in FIGS. 29A and 29B are bottom-contact transistors. When a bottom-contact transistor is used, the area where the oxide semiconductor layer and the conductive layers which serve as the source electrode and the drain electrode are in contact with each other can be increased, whereby peeling or the like can be prevented.

Note that oxide conductive layers can be provided between the oxide semiconductor layer and the conductive layers which serve as the source electrode and the drain electrode as in the driver circuit portion illustrated in FIG. 4.

Note that this embodiment can be combined as appropriate with any of the other embodiments.

Embodiment 13

In this embodiment, a logic circuit including a transistor having a structure different from that in the above embodiment will be described.

Transistors in a display device which is one embodiment of the present invention are not limited to the transistors having the structure illustrated in FIG. 2 and transistors having another structure may be used. A logic circuit to which a transistor having another structure is applied will be described with reference to FIGS. 30A and 30B. FIGS. 30A and 30B illustrate a structure of a driver circuit portion in this embodiment. FIG. 30A is a top view and FIG. 30B is a cross-sectional view taken along line Z1-Z2 and line Z3-Z4 of the driver circuit portion illustrated in FIG. 7A. Note that in the logic circuit illustrated in FIGS. 30A and 30B, the description of the logic circuit illustrated in FIGS. 2A and 2B can be employed for the description of the same components in the display device illustrated in FIGS. 2A and 2B.

The logic circuit illustrated in FIGS. 30A and 30B include the transistor 251, the transistor 252, and the transistor 253, like the logic circuit illustrated in FIGS. 2A and 2B.

Further, structures of the transistors will be described. The transistor 251 includes the gate electrode 211*a* over the substrate 201, the gate insulating layer 202 over the gate electrode 211*a*, the conductive layer 215*a* and the conductive layer 215*b* over the gate insulating layer 202, the oxide semiconductor layer 243*a* over the gate electrode 211*a* with the gate insulating layer 202 interposed therebetween and over the conductive layer 215*a* and the conductive layer 215*b*, and the oxide semiconductor layer 263*a* over the oxide semiconductor layer 243*a*.

The transistor 252 includes the gate electrode 211*b* over the substrate 201, the gate insulating layer 202 over the gate electrode 211*b*, the conductive layer 215*b* and the conductive layer 215*c* over the gate insulating layer 202, and the oxide semiconductor layer 263*b* over the gate electrode 211*b* with the gate insulating layer 202 interposed therebetween and over the conductive layer 215*b* and the conductive layer 215*c*.

The transistor 253 includes the gate electrode 211*c* over the substrate 201, the gate insulating layer 202 over the gate electrode 211*c*, the conductive layer 215*b* and the conductive layer 215*d* over the gate insulating layer 202, the oxide semiconductor layer 243*b* over the gate electrode 211*c* with the gate insulating layer 202 interposed therebetween and over the conductive layer 215*b* and the conductive layer 215*d*, and the oxide semiconductor layer 263*c* over the oxide semiconductor layer 243*b*.

Each of the conductive layers 215*a* to 215*d* serves as a source electrode or a drain electrode.

The thickness of the oxide semiconductor layer (a stack of the oxide semiconductor layer 243*a* and the oxide semiconductor layer 263*a*) in the transistor 251 is larger than the thickness of the oxide semiconductor layer (the oxide semiconductor layer 263*b*) in the transistor 252. In addition, the thickness of the oxide semiconductor layer (a stack of the oxide semiconductor layer 243*b* and the oxide semiconductor layer 263*c*) in the transistor 253 is larger than the thickness of the oxide semiconductor layer (the oxide semiconductor layer 263*b*) in the transistor 252. As the thickness of the oxide semiconductor layer increases, the absolute value of a negative voltage for a gate electrode which is needed to fully deplete the oxide semiconductor layer increases. As a result, a transistor including a thick oxide semiconductor layer as a channel formation layer behaves as a depletion type transistor.

The transistors 251 to 253 illustrated in FIGS. 30A and 30B are bottom-contact transistors. When a bottom-contact transistor is used, the area where the oxide semiconductor layer and the conductive layers which serve as the source electrode and the drain electrode are in contact with each other can be increased, whereby peeling or the like can be prevented.

Note that oxide conductive layers may be provided between the oxide semiconductor layer and the conductive layers which serve as the source electrode and the drain electrode as in the driver circuit portion illustrated in FIG. 8.

Note that this embodiment can be combined as appropriate with any of the other embodiments.

This application is based on Japanese Patent Application serial no. 2009-218931 filed with Japan Patent Office on Sep. 24, 2009, the entire contents of which are hereby incorporated by reference.

The invention claimed is:

1. A display device comprising:
    a driver circuit including a logic circuit, the logic circuit including a first transistor which is a depletion type transistor and a second transistor which is an enhancement type transistor;
    a signal line electrically connected to each of the first transistor and the second transistor;
    a pixel portion including a pixel whose display state is configured to be controlled by input of a signal including image data from the driver circuit through the signal line;
    a reference voltage line;
    a gate signal line; and
    a third transistor which is a depletion type transistor and includes a gate, a source, and a drain, and is configured to discharge electric charges from the signal line to the reference voltage line,
    wherein one of the source and the drain of the third transistor is electrically connected to the reference voltage line,
    wherein the other of the source and the drain of the third transistor is electrically connected to the signal line,
    wherein the gate of the third transistor is electrically connected to the gate signal line, and
    wherein the first to third transistors each include an oxide semiconductor layer having a channel formation region.

2. The display device according to claim 1,
    wherein the first to third transistors each include:
        a gate electrode;
        a gate insulating layer over the gate electrode;
        the oxide semiconductor layer over the gate insulating layer; and
        a first conductive layer and a second conductive layer over parts of the oxide semiconductor layer, the first conductive layer and the second conductive layer each serving as a source electrode or a drain electrode, and
    wherein the display device further comprises an oxide insulating layer over the oxide semiconductor layer, the first conductive layer, and the second conductive layer.

3. The display device according to claim 1, wherein the gate and the other of the source and the drain of the third transistor are located on two opposite sides of the oxide semiconductor layer of the third transistor.

4. The display device according to claim 1, further comprising a high power supply line and a low power supply line,
wherein the high power supply line is electrically connected to one of a source and a drain of the first transistor,
wherein an other of the source and the drain of the first transistor is electrically connected to one of a source and a drain of the second transistor,
wherein an other of the source and the drain of the second transistor is electrically connected to the low power supply line, and
wherein the other of the source and the drain of the first transistor and the one of the source and the drain of the second transistor are connected to the signal line.

5. The display device according to claim 1, wherein a width of the channel formation region of the third transistor is larger than a width of the channel formation region of the first transistor.

6. A display device comprising:
a driver circuit including a logic circuit, the logic circuit including a first transistor which is a depletion type transistor and a second transistor which is an enhancement type transistor;
a signal line electrically connected to each of the first transistor and the second transistor;
a pixel portion including a pixel whose display state is configured to be controlled by input of a signal including image data from the driver circuit through the signal line;
a reference voltage line;
a gate signal line; and
a third transistor which is a depletion type transistor and includes a gate, a source, and a drain, and is configured to discharge electric charges from the signal line to the reference voltage line,
wherein one of the source and the drain of the third transistor is electrically connected to the reference voltage line,
wherein the other of the source and the drain of the third transistor is electrically connected to the signal line,
wherein the gate of the third transistor is electrically connected to the gate signal line,
wherein the first to third transistors each include an oxide semiconductor layer having a channel formation region,
wherein a thickness of the oxide semiconductor layer in the first transistor is larger than a thickness of the oxide semiconductor layer in the second transistor, and
wherein a thickness of the oxide semiconductor layer in the third transistor is larger than a thickness of the oxide semiconductor layer in the second transistor.

7. The display device according to claim 6,
wherein the first to third transistors each include:
a gate electrode;
a gate insulating layer over the gate electrode;
the oxide semiconductor layer over the gate insulating layer; and
a first conductive layer and a second conductive layer over parts of the oxide semiconductor layer, the first conductive layer and the second conductive layer each serving as a source electrode or a drain electrode, and
wherein the display device further comprises an oxide insulating layer over the oxide semiconductor layer, the first conductive layer, and the second conductive layer.

8. The display device according to claim 6, wherein the gate and the other of the source and the drain of the third transistor are located on two opposite sides of the oxide semiconductor layer of the third transistor.

9. The display device according to claim 6, further comprising a high power supply line and a low power supply line,
wherein the high power supply line is electrically connected to one of a source and a drain of the first transistor,
wherein an other of the source and the drain of the first transistor is electrically connected to one of a source and a drain of the second transistor,
wherein an other of the source and the drain of the second transistor is electrically connected to the low power supply line, and
wherein the other of the source and the drain of the first transistor and the one of the source and the drain of the second transistor are connected to the signal line.

10. The display device according to claim 6, wherein a width of the channel formation region of the third transistor is larger than a width of the channel formation region of the first transistor.

11. A display device comprising:
a driver circuit including a logic circuit, the logic circuit including a first transistor which is a depletion type transistor and a second transistor which is an enhancement type transistor;
a signal line electrically connected to each of the first transistor and the second transistor;
a pixel portion including a pixel whose display state is configured to be controlled by input of a signal including image data from the driver circuit through the signal line;
a reference voltage line;
a gate signal line; and
a third transistor which is a depletion type transistor and includes a gate, a source, and a drain, and is configured to discharge electric charges from the signal line to the reference voltage line,
wherein one of the source and the drain of the third transistor is electrically connected to the reference voltage line,
wherein the other of the source and the drain of the third transistor is electrically connected to the signal line,
wherein the gate of the third transistor is electrically connected to the gate signal line, and
wherein the first to third transistors each include a first gate electrode, a second gate electrode, and an oxide semiconductor layer having a channel formation region between the first gate electrode and the second gate electrode.

12. The display device according to claim 11, wherein the gate and the other of the source and the drain of the third transistor are located on two opposite sides of the oxide semiconductor layer of the third transistor.

13. The display device according to claim 11, further comprising a high power supply line and a low power supply line,
wherein the high power supply line is electrically connected to one of a source and a drain of the first transistor,
wherein an other of the source and the drain of the first transistor is electrically connected to one of a source and a drain of the second transistor,
wherein an other of the source and the drain of the second transistor is electrically connected to the low power supply line, and
wherein the other of the source and the drain of the first transistor and the one of the source and the drain of the second transistor are connected to the signal line.

14. The display device according to claim 11, wherein a width of the channel formation region of the third transistor is larger than a width of the channel formation region of the first transistor.

15. A display device comprising:
   a signal line;
   a reference voltage line;
   a pixel portion including a pixel, the pixel including an enhancement type transistor including a gate, a source, and a drain, and configured to control writing of data from the signal line to the pixel;
   a depletion type transistor including a gate, a source, and a drain, and configured to discharge electric charges from the signal line to the reference voltage line,
   wherein one of the source and the drain of the enhancement type transistor is electrically connected to the signal line,
   wherein one of the source and the drain of the depletion type transistor is electrically connected to the reference voltage line,
   wherein the other of the source and the drain of the depletion type transistor is electrically connected to the signal line.

16. The display device according to claim 15, wherein the depletion type transistor includes an oxide semiconductor layer having a channel formation region.

17. The display device according to claim 15, wherein the depletion type transistor includes a first gate electrode, a second gate electrode, and an oxide semiconductor layer including a channel formation region between the first gate electrode and the second gate electrode.

18. The display device according to claim 15, further comprising:
   a driver circuit including a logic circuit, the logic circuit including a first transistor which is a depletion type transistor and a second transistor which is an enhancement type transistor, each of the first transistor and the second transistor including a gate, a source, and a drain,
   wherein one of the source and the drain of the first transistor and one of the source and the drain of the second transistor are electrically connected to the signal line.

19. The display device according to claim 18,
   wherein the first transistor includes an oxide semiconductor layer having a channel formation region and a second gate electrode in addition to the gate electrode,
   wherein the oxide semiconductor layer is sandwiched between the gate electrode and the second gate electrode.

20. The display device according to claim 15,
   wherein the depletion type transistor includes a semiconductor layer having a channel formation region, and
   wherein the gate and the one of the source and the drain of the depletion type transistor are located on two opposite sides of the semiconductor layer of the depletion type transistor.

21. The display device according to claim 15, further comprising a driver circuit, the driver circuit comprising a second additional depletion type transistor electrically connected to the signal line,
   wherein a width of a channel formation region of the depletion type transistor is larger than a width of a channel formation region of the second depletion type transistor.

* * * * *